United States Patent
Osawa et al.

(10) Patent No.: US 7,821,018 B2
(45) Date of Patent: Oct. 26, 2010

(54) GAN-BASED SEMICONDUCTOR LIGHT-EMITTING DEVICE AND METHOD FOR THE FABRICATION THEREOF

(75) Inventors: Hiroshi Osawa, Ichihara (JP); Takashi Hodota, Ichihara (JP)

(73) Assignee: Showa Denko K.K., Tokyo (JP)

( * ) Notice: Subject to any disclaimer, the term of this patent is extended or adjusted under 35 U.S.C. 154(b) by 95 days.

(21) Appl. No.: 12/279,654

(22) PCT Filed: Feb. 16, 2007

(86) PCT No.: PCT/JP2007/053331

§ 371 (c)(1),
(2), (4) Date: Oct. 28, 2008

(87) PCT Pub. No.: WO2007/094516

PCT Pub. Date: Aug. 23, 2007

(65) Prior Publication Data

US 2009/0278164 A1    Nov. 12, 2009

Related U.S. Application Data

(60) Provisional application No. 60/778,366, filed on Mar. 3, 2006.

(30) Foreign Application Priority Data

Feb. 16, 2006  (JP) .............................. 2006-039282
Apr. 14, 2006  (JP) .............................. 2006-111833

(51) Int. Cl.
  *H01L 29/201*  (2006.01)
  *H01L 21/00*  (2006.01)
(52) U.S. Cl. ............................ 257/90; 257/94; 257/97; 257/E33.003; 257/E33.025; 438/24; 438/46; 438/47

(58) Field of Classification Search ................... 438/24, 438/46, 47; 257/90, 94, 97, 103, E33.003, 257/E33.025
See application file for complete search history.

(56) References Cited

U.S. PATENT DOCUMENTS 7,034,330 B2 *  4/2006  Udagawa ...................... 257/16
7,495,261 B2 *  2/2009  Kusunoki et al. ............. 257/94
7,550,366 B2 *  6/2009  Suga et al. .................. 438/455

(Continued)

FOREIGN PATENT DOCUMENTS

JP    05-251739 A    9/1993
JP     6-296040 A    10/1994

(Continued)

*Primary Examiner*—Hsien-ming Lee
(74) *Attorney, Agent, or Firm*—Sughrue Mion, PLLC

(57) ABSTRACT

A GaN-based semiconductor light-emitting device 1 includes a stacked body 10A having the component layers 12 that include an n-type semiconductor layer, a light-emitting layer and a p-type semiconductor layer each formed of a GaN-based semiconductor, sequentially stacked and provided as an uppermost layer with a first bonding layer 14 made of metal and a second bonding layer 33 formed on an electroconductive substrate 31, adapted to have bonded to the first bonding layer 14 the surface thereof lying opposite the side on which the electroconductive substrate 31 is formed, made of a metal of the same crystal structure as the first bonding layer 14, and allowed to exhibit an identical crystal orientation in the perpendicular direction of the bonding surface and the in-plane direction of the bonding surface.

24 Claims, 19 Drawing Sheets

U.S. PATENT DOCUMENTS

| | | |
|---|---|---|
| 2004/0135166 A1 | 7/2004 | Yamada et al. |
| 2005/0062049 A1 | 3/2005 | Lin et al. |
| 2007/0278509 A1 | 12/2007 | Kusunoki et al. |

FOREIGN PATENT DOCUMENTS

| | | |
|---|---|---|
| JP | 3511970 B2 | 1/2004 |
| JP | 2004-235509 A | 8/2004 |
| JP | 2004-266240 A | 9/2004 |
| JP | 2004-337927 A | 12/2004 |
| JP | 2005-044887 A | 2/2005 |
| JP | 2005-101610 A | 4/2005 |
| JP | 2005-276988 A | 10/2005 |
| JP | 2005-303287 A | 10/2005 |
| WO | 2005/091391 A1 | 9/2005 |

* cited by examiner

HEXAGONAL CRYSTAL SYSTEM(00·1)

FACE-CENTERED CUBIC CRYSTAL SYSTEM(111)

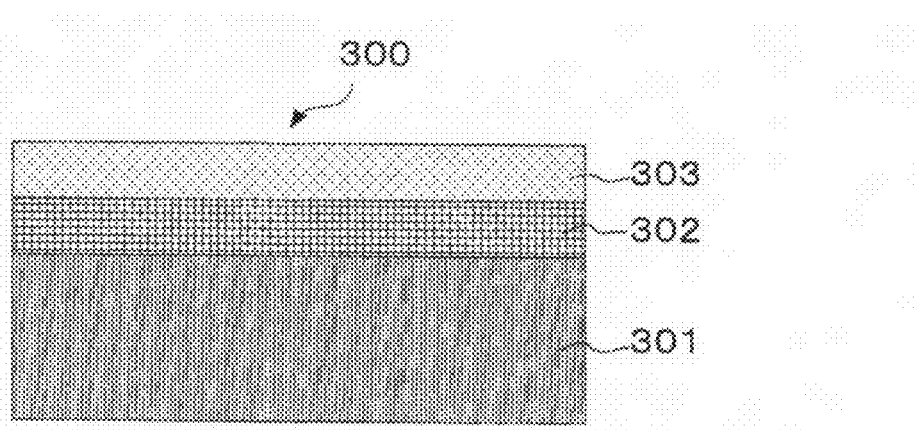
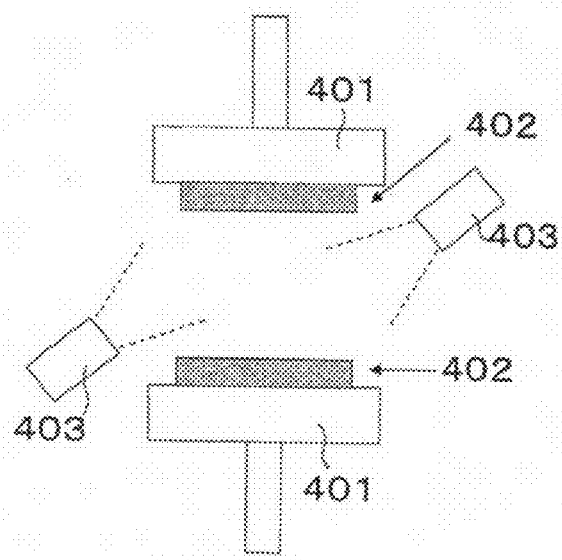
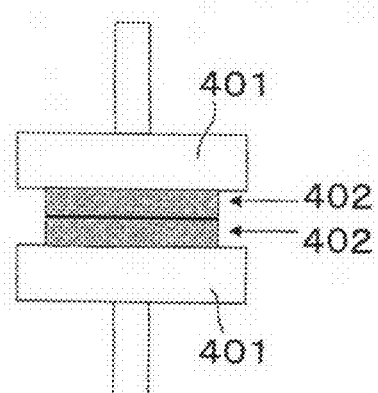

GAN-BASED SEMICONDUCTOR LIGHT-EMITTING DEVICE AND METHOD FOR THE FABRICATION THEREOF

CROSS REFERENCE TO RELATED APPLICATIONS

This application is a National Stage of International Application No. PCT/JP2007/053331 filed Feb. 16, 2007 claiming the benefit pursuant to 35 U.S.C. §119(e)(1) of the filing dates of Provisional Application No. 60/778,366 filed Mar. 3, 2006 and Japanese Patent Application No. 2006-039282 filed Feb. 16, 2006 and No. 2006-111833 filed Apr. 14, 2006 pursuant to 35 U.S.C. §111(b).

TECHNICAL FIELD

This invention relates to a GaN-based semiconductor light-emitting device provided with component layers each formed of a GaN-based semiconductor and a method for the fabrication thereof.

BACKGROUND ART

In recent years, GaN-based compound semiconductor materials have been attracting attention as semiconductor materials for use in short-wavelength light-emitting devices. The GaN-based compound semiconductors are formed on a substrate of a sapphire single crystal, various other oxides or Group III-V compounds by the MetalOrganic Chemical Vapor Deposition (MOCVD) method, Molecular Beam Epitaxy (MBE) method or the like.

The sapphire single crystal substrate, despite more than 10% difference in lattice constant from GaN, is finding popular acceptance because it is enabled to form thereon a good nitride semiconductor owing to the formation of a buffer layer of AlN or AlGaN. When a sapphire single crystal substrate is used, an n-type semiconductor layer, a light-emitting layer and a p-type semiconductor layer are stacked thereon sequentially in the order mentioned. Since the sapphire single crystal substrate is an insulator, the component structure thereof generally allows the existence of a positive electrode formed on the p-type semiconductor layer and a negative electrode formed on the n-type semiconductor layer. It comes in the two kinds, namely the face-up system that extracts light from the p-type semiconductor side by using a transparent electrode of Indium Tin Oxide (ITO), for example, as a positive electrode and the flip-chip system that extracts light from the sapphire substrate side by using a high-reflectance film of Ag, for example, as a positive electrode.

Though the sapphire single crystal substrate is generally finding a wide acceptance as described above, it entails several problems because it is an insulator.

The first problem is that, since the light-emitting layer is removed as by etching till the n-type semiconductor layer is exposed for the purpose of forming a negative electrode on the n-type semiconductor layer, the area of the light-emitting layer is decreased by the portion allocated for the formation of the negative electrode and the output is proportionately degraded.

The second problems is that, since both the positive electrode and the negative electrode exist on the same surface side of the substrate, the flow of electric current takes place inevitably in the horizontal direction and the portion of high current density is consequently formed locally, with the result that the device will generate heat.

The third problem is that, since the sapphire single crystal substrate has a low degree of thermal conductivity, the generated heat is not diffused and the temperature of the device is inevitably increased.

For the purpose of solving the problems enumerated above, the method for fabricating a nitride semiconductor light-emitting device by bonding an electroconductive substrate to a stacked body resulting from sequentially stacking an n-type semiconductor layer, a light-emitting layer and a p-type semiconductor layer in the order mentioned on a sapphire single crystal substrate, then removing the sapphire single crystal substrate and having a positive electrode and a negative electrode disposed on the upper and lower sides has been disclosed (refer to Japanese Patent No. 3511970).

The bonding of the electroconductive substrate entails various problems, such as the fluctuation of the thermal expansion coefficient of the substrate by the strength of bonding and the temperature of bonding and the increase of the resistance in the interface of bonding.

For the sake of heightening the strength of bonding, the method for bonding identical semiconductor devices after making the directions of crystal axes thereof coincide has been disclosed (refer to JP-A HEI 6-296040).

When this method is applied to a GaN-based semiconductor light-emitting device, it is necessary that a monocrystalline or polycrystalline substrate having all crystal faces gather in a uniaxial direction possessing electroconductivity be used as the substrate intended for bonding. When a silicon substrate is used, however, while it is advantageous to use a (111) face for the sake of heightening the bonding property of the silicon substrate with a GaN-based semiconductor device having an orientation of (00•1), it is actually difficult to heighten the bonding property because the length $a/\sqrt{2}$ of one side corresponding to the Si (111) face is 3.84 Å, a magnitude deviating by 22% from the lattice constant a of GaN which is 3.16 Å.

The GaN-based semiconductor light-emitting device is ordinarily formed on a sapphire single crystal substrate by using the MOCVD method. When it is bonded at a high temperature (in the neighborhood of 300° C.) with a eutectic alloy, such as AuSn, a large difference in thermal expansion coefficient between the sapphire single crystal substrate and the bonding substrate (electroconductive substrate) results in generating thermal stress and preventing the bonding from successfully proceeding. As regards this problem, the idea of choosing Cu—W, for example, which is substantially equal in thermal expansion coefficient to the sapphire single crystal substrate for use in the bonding substrate has been disclosed (refer to JP-A 2004-266240).

This method, however, entails such problems as limiting the kind of substrate to be used for the bonding substrate and betraying vulnerability to temperature owing to the use of a eutectic metal for the bonding.

For the purpose of avoiding the difference in thermal expansion coefficient between the two substrates, the method of implementing the bonding in the neighborhood of normal room temperature has been disclosed (refer to JP-A 2004-337927).

Since this method cleans and activates the bonding surfaces by irradiating them with an inert gas ion beam, for example, in vacuum in the neighborhood of normal room temperature, it is effective in coping with the problem of the thermal expansion coefficient of the substrate and the problem of the increase of resistance of the interface of bonding. In the case of the GaN-based semiconductor light-emitting device, however, this method used alone cannot obtain sufficient bonding strength.

This invention has been achieved in view of the state of affairs mentioned above and is aimed, in producing a GaN-based semiconductor light-emitting device by bonding an electroconductive substrate, such as a silicon substrate, to a stacked body resulting from stacking GaN-based semiconductors on a substrate and then removing the substrate on the stacked body side, at providing a GaN-based semiconductor light-emitting device capable of heightening bonding strength and amply lowering resistance component on the bonding interface and a method for the fabrication thereof.

DISCLOSURE OF THE INVENTION

For the purpose of accomplishing the object mentioned above, the present invention provides as the first aspect thereof a GaN-based semiconductor device comprising a stacked body having an n-type semiconductor layer, a light-emitting layer and a p-type semiconductor layer, each formed of a GaN-based semiconductor, sequentially stacked, and provided with a first bonding layer made of metal as an outermost layer; an electroconductive substrate; and a second bonding layer formed on the electroconductive substrate, adapted to have bonded to the first bonding layer a bonding surface thereof lying opposite a side on which the electroconductive substrate is formed, made of a metal of a same crystal structure as the first bonding layer, and allowed to exhibit an identical crystal orientation in both a perpendicular direction of the bonding surface and an in-plane direction of the bonding surface.

The second aspect of the invention includes the GaN-based semiconductor device according to the first aspect, further comprising a lattice-matching layer formed between the electroconductive substrate and the second bonding layer.

The third aspect of the invention includes the GaN-based semiconductor device according to the second aspect, wherein the lattice-matching layer is made of a simple metal of any one member or an alloy metal of two or more members selected from the group consisting of Hf, Mg and Zr.

The fourth aspect of the invention includes the GaN-based semiconductor device according to any one of the first to third aspects, wherein the first bonding layer and the second bonding layer possess a face-centered cubic structure and exhibit a crystal orientation of (111) in the perpendicular direction of the bonding surface.

The fifth aspect of the invention includes the GaN-based semiconductor device according to fourth aspect, wherein the first bonding layer and the second bonding layer are each formed of any one of Au, Ag, Cu, Pt, Pd, Rh, Cu and Ir.

The sixth aspect of the invention includes the GaN-based semiconductor device according to the fifth aspect, wherein the first bonding layer and the second bonding layer are each formed of Au or an Au alloy.

The seventh aspect of the invention includes the GaN-based semiconductor device according to any one of the first to third aspects, wherein the first bonding layer and the second bonding layer each have a hexagonal closest packing structure and a crystal orientation of (00•1) in the perpendicular direction of the bonding surface.

The eighth aspect of the invention includes the GaN-based semiconductor device according to the seventh aspect, wherein the first bonding layer and the second bonding layer are each formed of Ru or Re.

The ninth aspect of the invention includes the GaN-based semiconductor device according to any one of the first to eighth aspects, wherein the first bonding layer and the second bonding layer have a difference within 5% in lattice constant.

The tenth aspect of the invention includes the GaN-based semiconductor device according to any one of the first to ninth aspects, wherein the electroconductive substrate is a silicon substrate formed of silicon single crystal.

The eleventh aspect of the invention includes the GaN-based semiconductor device according to the tenth aspect, wherein the electroconductive substrate is a silicon substrate formed of silicon single crystal and possesses a (111) face as a substrate surface.

The twelfth aspect of the invention includes the GaN-based semiconductor device according to the eleventh aspect, wherein the second bonding layer is directly deposited on the (111) face of the silicon substrate.

The thirteenth aspect of the invention includes the GaN-based semiconductor device according to the eleventh aspect, further comprising an orientation adjusting layer formed between the silicon substrate and the second bonding layer.

The fourteenth aspect of the invention includes the GN-based semiconductor device according to the thirteenth aspect, wherein the orientation adjusting layer is formed of Ag or an Ag alloy.

The present invention further provides as the fifteenth aspect thereof a method for the fabrication of a GaN-based semiconductor light-emitting device comprising the steps of forming on a substrate a first stacked body having sequentially stacked at least an n-type semiconductor layer, a light-emitting layer and a p-type semiconductor layer each made of a GaN-based semiconductor and having a first bonding layer made of metal as an uppermost layer, forming on an electroconductive substrate a second stacked body possessing a second bonding layer made of a metal of a same crystal structure as the first bonding layer and exhibiting an identical crystal orientation in both a perpendicular direction of a bonding surface and an in-plane direction of the bonding surface, integrating the first stacked body and the second stacked body by mutual bonding and removing the substrate from the first stacked body.

The sixteenth aspect of the invention includes the method for the fabrication of a GaN-based semiconductor light-emitting device according to the fifteenth aspect, wherein the mutual bonding is implemented by irradiating bonding surfaces of the bonding layers in vacuum with an inert gas ion beam or an inert gas neutral atom beam.

The seventeenth aspect of the invention includes the method for the fabrication of a GaN-based semiconductor light-emitting device according to the fifteenth or sixteenth aspect, wherein the substrate is made of sapphire.

The eighteenth aspect of the invention includes the method for the fabrication of a GaN-based semiconductor light-emitting device according to any one of the fifteenth to seventeenth aspects, wherein the electroconductive substrate is a silicon substrate formed of silicon single crystal and possessing a (111) face as a substrate surface and, when the second bonding layer has a face-centered cubic structure (111) face of Au, Ag, Cu, Pt, Pd, Rh, Cu or Ir or a hexagonal closest packing (00•1) face of Ru or Re, the substrate surface is cleaned by RCA cleaning and then subjected to hydrogen termination with dilute hydrofluoric acid, and thereafter the second bonding layer is formed using a film-depositing device provided with vacuum of an extremely high degree.

The nineteenth aspect of the invention includes the method for the fabrication of a GaN-based semiconductor light-emitting device according to the eighteenth aspect, wherein the vacuum is higher than $1.0 \times 10^{-4}$ Pa.

According to this invention, since the bonding layer on the stacked body side and the bonding layer on the silicon substrate or other electroconductive substrate side are formed of metals of the same crystal structure and enabled to possess an identical crystal orientation in both the perpendicular direction of the bonding surface and the in-plane direction of the bonding surface, it is made possible to heighten the bonding strength between both the bonding layers and amply lower the resistance component of the interface of bonding.

The above and other objects, characteristic features and advantages of the present invention will become apparent to those skilled in the art from the description to be given herein below with reference to the accompanying drawings.

BRIEF DESCRIPTION OF THE DRAWINGS

FIG. 4 is a schematic cross section illustrating an example of the structure of a second stacked body.

FIG. 5(A) and FIG. 5(B) are schematic views depicting the bonding of the first stacked body and the second stacked body.

BEST MODE FOR CARRYING OUT THE INVENTION

The embodiment of this invention will be described in detail by reference to the accompanying drawings.

Figure 1A:
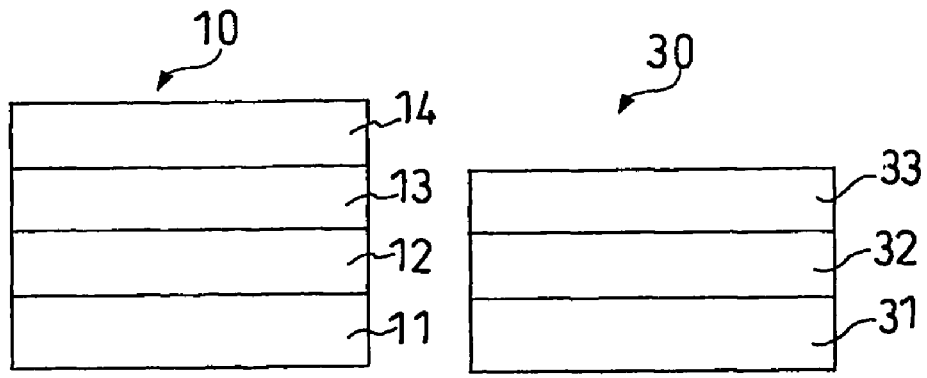
FIG. 1(A) to FIG. 1(C) are explanatory views depicting the steps of the procedure of a method for fabricating a GaN-based semiconductor light-emitting device contemplated by this invention.
Figure 1B:
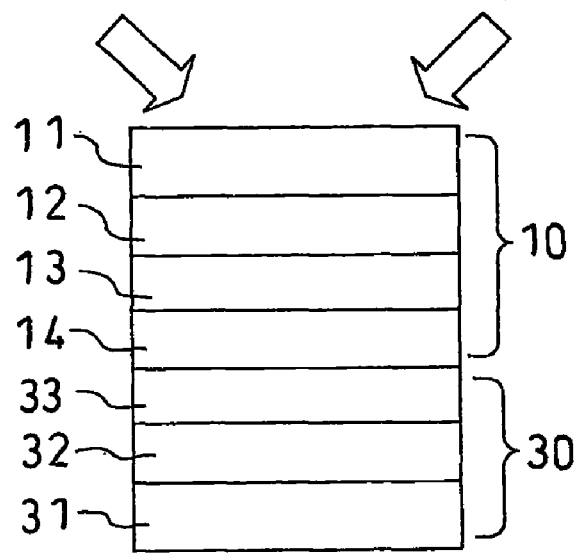
Figure 1C:
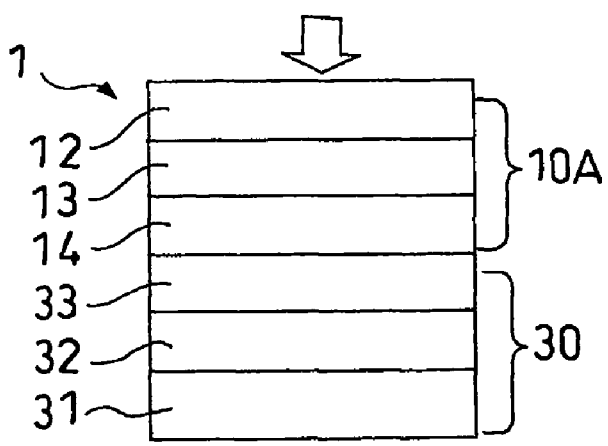

FIG. 1(A) to FIG. 1(C) are explanatory views depicting the steps of the procedure of a method for the fabrication of a GaN-based semiconductor light-emitting device according to the present invention.

The step of FIG. 1(A) produces a first stacked body 10 by sequentially stacking on a substrate 11 the component layers 12, namely an n-type semiconductor layer, a light-emitting layer and a p-type semiconductor layer, each made of a GaN-based semiconductor, further forming an intervening layer 13, and thereafter forming a first bonding layer 14 made of metal as the uppermost layer.

Then, a second stacked body 30 is produced by forming an intermediate layer 32 on an electroconductive substrate 31 and then forming a second bonding layer 33 on the intermediate layer 32. The second bonding layer 33 is made of a metal having the same crystal structure as the first bonding layer and enabled to exhibit an identical crystal orientation in both the perpendicular direction of the bonding surface and the in-plane direction of the bonding surface.

The next step of FIG. 1(B) has the first stacked body 10 and the second stacked body 30 integrated by mutually bonding the first bonding layer 14 and the second bonding layer 33.

The subsequent step of FIG. 1(C) gives rise to a GaN-based semiconductor light-emitting device 1 by removing the substrate 11 from the first stacked body 10 and then installing electrodes (omitted from illustration).

Incidentally, this invention herein contemplates providing the first stacked body with the intervening layer 13 and the second stacked body 30 with the intermediate layer 32. The intervening layer 13 and the intermediate layer 32 are layers such that they may be omitted or conveniently installed as occasion demands. An ohmic contact layer, a reflecting layer and a mutual diffusion preventing layer are available as the intervening layer 13, and a lattice matching layer and an orientation matching layer are available as the intermediate layer 32.

The GaN-based semiconductor light-emitting device 1 produced in accordance with the foregoing procedure is furnished, as illustrated in FIG. 1(C), at least with the stacked body 10 having sequentially stacked the component layers 12 each made of a GaN-based semiconductor and possessing as the uppermost layer (one end layer) the first bonding layer 14 made of metal and the second bonding layer 33 fated to be bonded to the first bonding layer 14. The second bonding layer 33 is formed on the electroconductive substrate 31 and as well has the surface thereof on the side opposite the side on which the electroconductive substrate 31 is formed bonded to the first bonding layer 14. The first bonding layer 14 and the second bonding layer 33 are each made of metal of the same crystal structure and are made to exhibit an identical crystal orientation in both the perpendicular direction of the bonding surface and the in-plane direction of the bonding surface.

Next, the GaN-based semiconductor light-emitting device and the method for the fabrication thereof contemplated by this invention will be described more specifically below by reference to FIG. 2 to FIG. 8.

Figure 2:
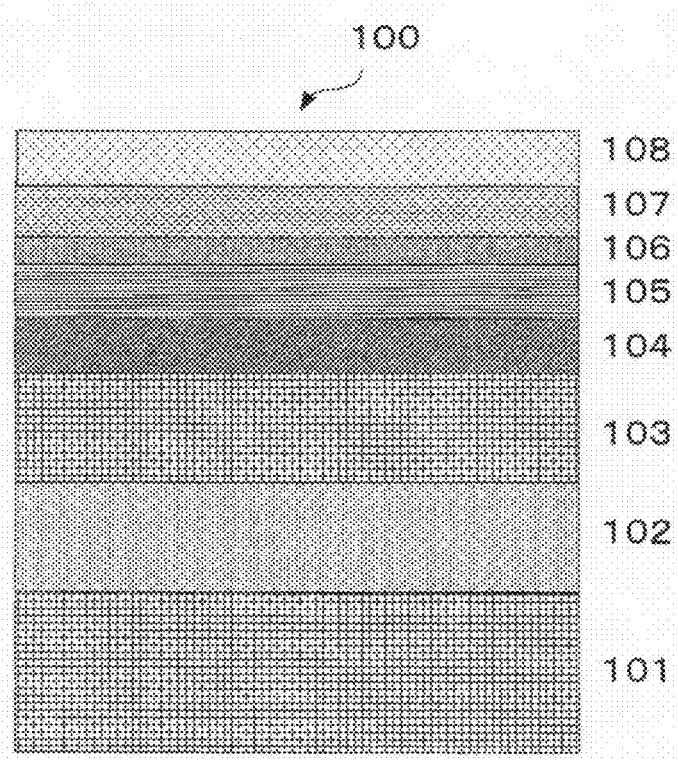
FIG. 2 is a schematic cross section illustrating an example of the structure of a first stacked body.

FIG. 2 is a schematic cross section illustrating an example of the structure of the first stacked body. As illustrated, a first stacked body 100 is configured by having a GaN layer 102, an n-type semiconductor layer 103, a light-emitting layer 104, a p-type semiconductor layer 105, an ohmic contact layer 106, a reflecting layer 107 and a first bonding layer 108 stacked sequentially on a substrate 101.

For the substrate 101, the substrate materials including oxide single crystals, such as sapphire single crystal ($Al_2O_3$; A face, C face, M face, R face), spinel single crystal ($MgAl_2O_4$), ZnO single crystal, $LiAlO_2$ single crystal, $LiGaO_2$ single crystal and MgO single crystal, Si single crystal, SiC single crystal, GaAs single crystal, AlN single crystal, GaN single crystal, and $ZrB_2$ and other boride single crystals have been universally known. This invention permits use of any of the substrate materials including the universally known substrate materials without any limit. Among other substrate materials enumerated above, the sapphire single crystal and the SiC single crystal prove to be particularly preferable. Incidentally, the plane direction of the substrate 101 is not particularly restricted. The substrate 101 may be a just substrate or a substrate having imparted therein an off angle.

On the substrate 101, an n-type semiconductor layer, a light-emitting layer and a p-type semiconductor layer each formed of a GaN-based semiconductor are generally stacked via a GaN layer 102 intended as a buffer layer. The growth conditions of the substrate and the epitaxial layer to be used possibly results in obviating the necessity of using the buffer layer.

As the GaN-based semiconductor, numerous GaN-based semiconductors represented by the general formula, $Al_XGa_YIn_ZN_{1-A}M_A$ ($0 \leq x \leq 1$, $0 \leq y \leq 1$, $0 \leq z \leq 1$, $X+Y+Z=1$, the symbol M denotes a Group V element other than nitrogen (N), and A satisfies $0 \leq A \leq 1$), have been known. This invention also permits use of the GaN-based semiconductors represented by the general formula, $Al_XGa_YIn_ZN_{1-A}M_A$ ($0 \leq x \leq 1$, $0 \leq y \leq 1$, $0 \leq z \leq 1$ and $X+Y+Z=1$, the symbol M denotes a Group V element other than nitrogen (N), and A satisfies $0 \leq A < 1$), including the universally known GaN-based semiconductors without any limit.

The GaN-based semiconductor is allowed to contain not only Al, Ga and In, but also other Group III elements and is further allowed, when necessary, to contain elements, such as Ge, Si, Mg, Ca, Zn, Be, P, As and B. Besides the intentionally added elements, it may possibly contain impurities inevitably contained depending on the film-forming conditions, and trace impurities entrained by the raw materials and the material of the reaction tube.

The method for growing the GaN-based semiconductor is not particularly restricted. All the methods, such as MOCVD (MetalOrganic Chemical Vapor Deposition) method, HVPE (Hydride Vapor Phase Epitaxy) method and MBE (Molecular Beam Epitaxy) method, heretofore known to allow growth of a GaN-based semiconductor may be adopted. The MOCVD method proves to be a preferred means of growth from the viewpoint of film thickness controlling property and mass production property.

The MOCVD method uses hydrogen (H) or nitrogen (N) as the carrier gas, trimethyl gallium (TMG) or triethyl gallium (TEG) as the Ga source, namely a Group III raw material, trimethyl aluminum (TMA) or triethyl aluminum (TEA) as the Al source, trimethyl indium (TMI) or triethyl indium (TEI) as the In source, and ammonia ($NH_3$), hydrazine ($N_2H_4$) or the like as the N source, namely a Group V raw material. Then, as the n-type dopant, monosilane ($SiH_4$) or disilane ($Si_2H_6$) can be used as the Si raw material and an organic germanium compound, such as germane gas ($GeH_4$), tetramethyl germanium (($CH_3)_4Ge$) or tetraethyl germanium (($C_2H_5)_4Ge$), as the Ge raw material.

For the MBE method, elementary germanium can be used as a doping source. As the p-type dopant, biscyclopentadiethyl magnesium ($Cp_2Mg$) or bisethylcyclopentadiethyl magnesium ($EtCp_2Mg$), for example, is used as the Mg raw material.

The n-type semiconductor layer 103 is generally composed of an under layer, an n-contact layer and an n-clad layer.

The n-contact layer can serve concurrently as an under layer and/or an n-clad layer. The under layer prefers to be formed of an $Al_XGa_{1-X}N$ layer ($0 \leq x \leq 1$, preferably $0 \leq x \leq 0.5$, and more preferably $0 \leq x \leq 0.1$). The film thickness thereof is 0.1 μm or more, preferably 0.5 μm or more, and more preferably 1 μm or more. The film thickness exceeding this level allows easy acquisition of an $Al_XGa_{1-X}N$ layer excelling in crystallinity.

The under layer may be doped with an n-type impurity up to a concentration in the range of $1 \times 10^{17}/cm^3$ to $1 \times 10^{19}/cm^3$, though the undoped state ($<1 \times 10^{17}/cm^3$) proves to be favorable in terms of good crystallinity. Though the kind of this n-type impurity does not need to be particularly limited, Si, Ge, Sn and the like may be cited as concrete examples. Si and Ge prove to be more preferable.

The temperature for the growth of the under layer is adjusted preferably in the range of 800 to 1200° C. and more preferably in the range of 1000 to 1200° C. The growth implemented at a temperature in this range enables impartation of good crystallinity to the product. Further, the pressure in the MOCVD growth furnace is adjusted in the range of 15 to 40 kPa.

The n-contact layer prefers to be formed of an $Al_XGa_{1-X}N$ layer ($0 \leq x \leq 1$, preferably $0 \leq x \leq 0.5$, and more preferably $0 \leq x \leq 0.1$) similarly to the under layer. The n-contact layer prefers to be doped with an n-type impurity. The containing of an n-type impurity at a concentration in the range of $1 \times 10^{17}/cm^3$ to $1 \times 10^{19}/cm^3$, preferably in the range of $1 \times 10^{18}/cm^3$ to $1 \times 10^{19}/cm^3$, proves to be favorable in terms of maintaining good ohmic contact with the negative electrode, suppressing the occurrence of a crack and maintaining good crystallinity. Though the kind of this n-type impurity is not particularly limited, Si, Ge, Sn and the like may be cited as examples. Si and Ge prove to be particularly favorable. The growth temperature of the n-contact layer is similar to that of the under layer.

The GaN-based semiconductor of which the n-contact layer is formed prefers to have the same composition as the under layer. The total film thickness of the n-contact layer and the under layer prefers to be set in the range of 1 to 20 μm, preferably 2 to 15 μm, and more preferably 3 to 12 μm. When the total film thickness of the n-contact layer and the under layer falls in the range mentioned above, the semiconductor is allowed to maintain good crystallinity.

It is preferable to have an n-clad layer interposed between the n-contact layer and the light-emitting layer 104. This is because the flattening property generated on the surface of the n-contact layer can be kept from aggravation. The n-clad layer may be formed of AlGaN, GaN, GaInN and the like. It may be otherwise in the form of a hetero-junction composed of such nitride components or a superlattice structure resulting from stacking them in a plurality of cycles. When the n-clad layer is formed of GaInN, it prefers needless to say to have a larger band gap energy than the GaInN of the light-emitting layer 104.

Though the film thickness of the n-clad layer is not particularly limited, it prefers to be in the range of 0.005 to 0.5 µm, and more favorably 0.005 to 0.1 µm. The n-type dopant concentration of the n-clad layer is preferably in the range of $1\times10^{17}/m^3$ to $1\times10^{20}/m^3$ and more preferably $1\times10^{18}/m^3$ to $1\times10^{19}/cm^3$. The dopant concentration falling in this range proves to be favorable in terms of maintaining good crystallinity and lowering the operating voltage of the device.

As the light-emitting layer 104 to be stacked on the n-type semiconductor layer 103, this invention generally uses a light-emitting layer that is formed of a GaN-based semiconductor, preferably a GaN-based semiconductor of $Ga_{1-S}In_SN$ (0<S<0.4). Though the film thickness of the light-emitting layer 104 is not particularly limited, a film thickness of such a degree as allows acquisition of a quantum effect, namely a critical film thickness, may be cited as an example. Specifically, it prefers to be in the range of 1 to 10 nm and more favorably 2 to 6 nm. The film thickness of the light-emitting layer falling in this range proves to be favorable in terms of the output of light emission.

Besides the Single Quantum Well (SQW) structure, the light-emitting layer may be in a Multiple Quantum Well (MQW) structure that comprises a well layer formed of the $Ga_{1-S}In_SN$ and an $Al_CGa_{1-C}N$ (0≦C<0.3) barrier layer having a larger band gap energy than the well layer. Then, the well layer and the barrier layer may be doped with an impurity.

The growth temperature of the $Al_CGa_{1-C}N$ barrier layer prefers to be 700° C. or more. The growth implemented at a temperature in the range of 800 to 1100° C. proves to be advantageous for the sake of enhancing crystallinity. The GaInN well layer is grown at a temperature in the range of 600 to 900° C. and preferably 700 to 900° C. Specifically, for the purpose of enhancing the crystallinity of MQW structure, it is favorable to impart a difference in growth temperature between the two layers.

The p-type semiconductor layer 105 is generally composed of a p-clad layer and a p-contact layer. The p-contact layer may serve concurrently as a p-clad layer.

The p-clad layer is formed of such a composition that surpasses the band gap energy of the light-emitting layer 104. It does not need to be particularly restricted, but is only required to be capable of entrapping a carrier in the light-emitting layer 104. The p-clad layer that is formed of $Al_dGa_{1-d}N$ (0<d≦0.4 and preferably 0.1≦d≦0.3) may be cited as a preferred example. The p-clad layer that is formed of this AlGaN proves to be favorable in terms of the entrapment of a carrier in the light-emitting layer. Though the film thickness of the p-clad layer is not particularly limited, it is preferably in the range of 1 to 400 nm and more preferably 5 to 100 nm. The p-type dopant concentration of the p-clad layer is preferably in the range of $1\times10^{18}/cm^3$ to $1\times10^{21}/cm^3$ and more preferably $1\times10^{19}/cm^3$ to $1\times10^{20}/cm^3$. When the p-type dopant concentration falls in the range mentioned above, it is made possible to obtain an excellent p-type crystal without degrading crystallinity.

The p-contact layer is a GaN-based semiconductor layer including at least $Al_eGa_{1-e}N$ layer (0≦e<0.5, preferably 0≦e≦0.2, and more preferably 0≦e≦0.1). The fact that the Al composition falls in the range mentioned above proves to be advantageous in terms of maintaining good crystallinity and establishing a good ohmic contact with the p-ohmic electrode. The fact that the p-type impurity (dopant) is contained at a concentration in the range of $1\times10^{18}/cm^3$ to $1\times10^{21}/cm^3$ and preferably $5\times10^{19}/cm^3$ to $5\times10^{20}/cm^3$ proves to be advantageous in terms of maintaining a good ohmic contact, preventing the occurrence of a crack and maintaining good crystallinity. Though the p-type impurity is not particularly limited, Mg may be cited as a preferred example. The film thickness, though not particularly limited, is preferably in the range of 0.01 to 0.5 µm and more preferably 0.05 to 0.2 µm. The fact that the film thickness is in this range proves to be advantageous in terms of the output of light emission.

Since the GaN layer 102, n-type semiconductor layer 103, light-emitting layer 104 and p-type semiconductor layer 105 are invariably GaN-based single crystals, the purpose of controlling the crystal orientation of the first bonding layer 108 makes it necessary to control the crystal orientations of both the ohmic contact layer 106 and the reflecting layer 107.

The crystal of GaN has a wurtzite structure and a lattice constant of α=3.16 Å, c=5.13 Å. The p-type semiconductor layer 105 contacted by the ohmic contact layer 106 has the lattice constant thereof varied by the addition of Al. Since the amount of Al so added is at most about 10%, the lattice constant may be safely estimated to be about α=3.16 Å. (Since the crystal of AlN also has a wurtzite structure and a lattice constant of α=3.08 Å, c=4.93 Å, the lattice constant remains substantially intact when the amount of this addition is about 10%.)

When the substrate 101 is made of sapphire single crystal, the GaN-based single crystals (GaN layer 102, n-type semiconductor layer 103, light-emitting layer 104 and p-type semiconductor layer 105) that are stacked on the substrate 101 have a (00•1) orientation. Thus, the ohmic contact layer 106, reflecting layer 107 and first bonding layer 108 that are stacked thereon prefer to possess a hexagonal crystal (00•1) face or a face-centered cubic crystal (111) face.

For the purpose of enabling the hexagonal crystal (00•1) face to be oriented on the (00•1) orientation of the GaN-based single crystal, the difference in lattice constant prefers to be within 20%. So long as the difference falls in this range, the crystal orientations can be lined up in the perpendicular direction of bonding surface. Since the GaN has a lattice constant α=3.16 Å, the hexagonal crystals to be used for the ohmic contact layer 106, reflecting layer 107 and first bonding layer 108 prefer to have lattice constants in the range of α=2.53 Å to 3.79 Å. The lattice constant c may assume any value because the orientation is (00•1).

The GaN-based semiconductor, when observed in the in-plane direction of bonding, shows a structure having hexagons regularly arranged as illustrated in FIG. 3. With the object of enabling the crystal orientations to be lined up in the in-plane direction of bonding, therefore, it is preferable to use such a single crystal that crystal orientations thereof are lined up from the beginning in the in-plane direction. For the sake of enabling the crystal orientations to be lined up in the in-plane direction of bonding, the difference in lattice constant prefers to be within 20% similarly to the perpendicular direction of bonding surface. Incidentally, the statement that the crystal orientations are lined up in the in-plane direction of bonding means that the regular crystal structure is maintained in the bonding surface. The GaN single crystal, for example, is enabled to maintain the regularity of hexagonal axis of symmetry in the in-plane direction when the (00•1) face is oriented because this crystal has a hexagonal shape. In this case, the regularity of hexagonal axis of symmetry is ultimately maintained even in the bonding layer.

Figure 3A:
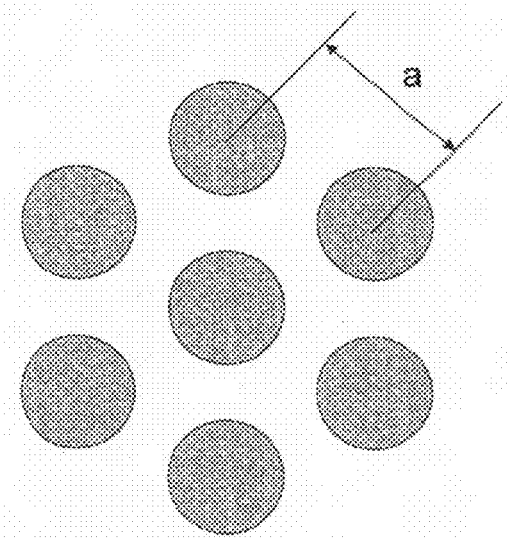
FIG. 3(A) is an explanatory view showing the lattice constant a of the hexagonal crystal system and FIG. 3(B) is an explanatory view showing that of the face-centered cubic crystal system.
Figure 3B:
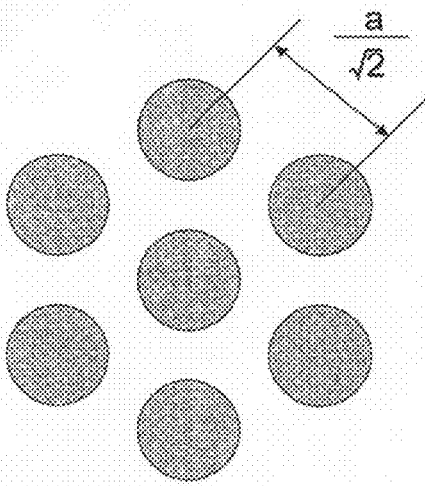

The (111) face of the face-centered cubic crystal system assumes a crystal face of the same pattern as the (00•1) face of the hexagonal crystal system as illustrated in FIG. 3(A) and FIG. 3(B). The value $1/\sqrt{2}$ of the lattice constant a of the face-centered crystal system equals the lattice constant a of the hexagonal crystal system. Since the difference in lattice constant prefers to be within 20% similarly to the case of the hexagonal crystal system, the face-centered cubic crystals to be used for the ohmic contact layer 106, reflecting layer 107 and first bonding layer 108 prefer to have lattice constants in the range of $\alpha=3.58$ Å to 5.36 Å. When the GaN-based single crystals having lattice constants in this range are used, the relevant crystal orientations can be lined up in both the perpendicular direction of bonding surface and the in-plane direction of bonding surface.

Incidentally, the dot "•" in the symbol of the crystal face denotes the form of omission of the Miller-Bravais indeces representing a crystal face. That is, in the hexagonal system, such as GaN, the crystal face is generally expressed with the four indeces (hkil), wherein the index "i" is defined as i=-(h+k). In the form omitting this part "i," the symbol (hk·l) is used.

As the property the ohmic contact layer is expected to possess, it is necessary that the contact resistance the layer exerts on the p-type semiconductor layer 105 be small. In this invention, it is further necessary that the crystal structure and the lattice constant both fall in the ranges mentioned above.

As the material for the ohmic contact layer 106, it is favorable to use Pt (face-centered cubic crystal structure, $\alpha=3.93$ Å), Ru (hexagonal maximum likelihood packing structure, $\alpha=2.70$ Å), Re (hexagonal maximum likelihood packing structure, $\alpha=2.76$ Å), Os (hexagonal maximum likelihood packing structure, $\alpha=2.74$ Å), Rh (face-centered cubic crystal structure, $\alpha=3.80$ Å), Ir (face-centered crystal structure, $\alpha=3.84$ Å), Pd (face-centered crystal structure, $\alpha=3.89$ Å) or other platinum family elements or Ag (face-centered crystal structure, $\alpha=4.09$ Å). Among other elements enumerated above, Pt, Ir, Rh and Ru prove to be favorable and Pt proves to be particularly favorable.

Though the use of Ag for the ohmic contact layer 106 is favorable for the sake of obtaining good reflection, this element exerts larger contact resistance than Pt. It is, therefore, permissible to use Ag for an application such that no appreciably high contact resistance is needed.

The ohmic contact layer 106 preferably has a thickness of 0.1 nm or more for the sake of stably obtaining low contact resistance. More preferably, the thickness is 1 nm or more for the sake of obtaining uniform contact resistance. Further, since the ohmic contact layer 106 has a low reflection factor as compared with an Ag alloy, for example, it preferably has a film thickness of 30 nm or less and more preferably 10 nm or less.

For the reflecting layer 107, Ag, Al (face-centered crystal structure, $\alpha=4.05$ Å) or the like may be used. For the sake of enabling Ag to acquire enhanced resistance to corrosion and to temperature, the addition thereto of Mo, Cu, Nd or the like is effective. This addition brings about no appreciable change in lattice constant because the amount of addition of any of these elements is invariably 5 at % or less. For the sake of enabling Al to acquire enhanced flatness, the addition thereto of Nd, for example, is effective. This addition brings about no appreciable change in lattice constant because the amount of addition of such element is 5 at % or less.

For the first bonding layer 108, any simple metal or alloy so long as the metal or alloy has a lattice structure and a lattice constant $\alpha=2.53$ Å to 3.79 Å in the case of a hexagonal crystal system or $\alpha=3.58$ Å to 5.36 Å in the case of a face-centered cubic crystal system. The metal, however, prefers to be such that the surface thereof is easily activated when the metal is irradiated in vacuum with an inert gas ion beam or an inert gas neutral atom beam during the course of bonding. Incidentally, the term "activation" as used herein refers to the state in which the surface is stripped of adhering impurity and the dangling bond is exposed. Since metal more often than not has the surface thereof oxidized in the air, the ease with which the metal can be stripped of an oxide film increases in proportion as the affinity of the metal for oxygen decreases. The use of a noble metal, therefore, proves to be favorable.

The metals usable for the first bonding layer 108 preferably include simple metals, such as Au, Ag, Ir, Pt, Pd, Rh, Ru, Re and Cu or alloys containing two or more kinds of such simple metals.

The metal to be used for the first bonding layer 108 is selected, depending on the metal that is used for a second bonding layer 303 which will be specifically described herein below. When the second bonding layer 303 allows use of simple metals, such as Au, Ag, Ir, Pt, Pd, Rh and Cu that assume a face-centered cubic structure or alloys containing two or more kinds of such simple metals, the metals usable for the first bonding layer 108 include simple metals, such as Au, Ag, Ir, Pt, Pd, Rh, and Cu, or alloys containing two or more kinds of such simple metals. In this case, the first bonding layer 108 and the second bonding layer 303 are required to possess the same face-centered cubic structure of crystal and the same crystal orientation in both the perpendicular direction of bonding surface and the in-plane direction of bonding surface.

On the other hand, when the second bonding layer 303 allows use of simple metals such as Ru and Re, that assume a hexagonal maximum likelihood packing structure or alloys containing two or more kinds of such simple metals, the metals usable for the first bonding layer 108 include simple metals, such as Ru and Re, that assume a hexagonal maximum likelihood packing structure or alloys containing two or more kinds of such simple metals. In this case, the first bonding layer 108 and the second bonding layer 303 are required to possess the same hexagonal maximum likelihood packing structure of crystal and the same crystal orientation in both the perpendicular direction of bonding surface and the in-plane direction of bonding surface.

Between the reflecting layer 107 and the first bonding layer 108, a layer adapted to enhance adhesion and prevent mutual diffusion between the reflecting layer 107 and the first bonding layer 108 may be interposed. Even when this layer is installed, the simple metal or the alloy forming this layer is required to possess a lattice structure and a lattice constant $\alpha=2.53$ Å to 3.79 Å in the case of a hexagonal crystal system or $\alpha=3.58$ Å to 5.36 Å in the case of a face-centered cubic crystal system. When Ag is used for the reflecting layer 107 and Au for the first bonding layer, for example, these two layers inevitably induce mutual diffusion because Ag and Au are wholly used for forming a solid solution. A mutual diffusion preventing layer that serves to prevent this mishap allows use of Pt, Ru, Re, Os, Rh, Ir, Pd, Ti (hexagonal closest packing structure, $\alpha=2.95$ Å), Hf (hexagonal closest packing structure, $\alpha=3.20$ Å), Zr (hexagonal closest packing structure, $\alpha=3.23$ Å) or the like.

FIG. 4 is a schematic cross section of an example of the structure of the second stacked body. Referring to the drawing, the second stacked body 300 is configured by having a lattice-matching layer 302 and the second bonding layer 303 stacked in the order mentioned on an electroconductive substrate 301. Incidentally, the lattice-matching layer 302 does not need to be elaborately installed when the electroconductive substrate 301 and the second bonding layer 303 are enabled to secure a lattice-matching property.

Though the electroconductive substrate 301 allows use of any substance so long as the substance possesses elecoconductivity, it prefers to utilize the (111) face of a silicon single crystal possessing electroconductivity. Since the (111) face of the silicon single crystal has the same atomic arrangement as the GaN (00•1) face, it enables the (111) face of the face-centered cubic structure of Au, Ag, Pt, Pd, Rh, Cu, Ir or the like and the (00•1) face of the hexagonal closest packing structure of Ru, Re or the like to be easily oriented. Thus, the second bonding layer 303 prefers to be formed of a metal possessing such face-centered cubic structure or hexagonal closest packing structure. Since Si has a lattice constant $\alpha=5.43$ Å, a magnitude deviating by as much as 25% from the lattice constant $\alpha=4.08$ Å of Au having a face-centered cubic structure, direct orientation is obtained with difficulty.

It is favorable to use the lattice-matching layer 302 for the purpose of orienting the (111) face of the face-centered cubic structure of Au, Ag, Cu, Pt, Pd, Rh, Cu, Ir or the like or the (00•1) face of the hexagonal closest packing structure of Ru, Re or the like on the (111) face of Si.

The fact that the lattice-matching layer 302 possesses a hexagonal closest packing structure and manifests a deviation by within 20% from the lattice constant of 3.84 Å of the length $\alpha/\sqrt{2}$ of the corresponding side of the (111) face of Si is favorable in enabling the (00•1) of a hexagonal closest packing structure to be oriented on the (111) face of Si. Since Si is used in the form of single crystal, the crystal orientations can be lined up in the in-plane direction of the bonding surface so long as the difference in lattice constant is within 20%.

The use of Hf (hexagonal closest packing structure, $\alpha=3.20$ Å), Mg (hexagonal closest packing structure, $\alpha=3.21$ Å) or Zr (hexagonal closest packing structure, $\alpha=3.23$ Å) for the lattice-matching layer 302 proves to be favorable in respect that the deviation from the lattice constant of 3.84 Å of the length $\alpha/\sqrt{2}$ of the corresponding side of the (111) face of Si falls within 20%.

The substrate 301 formed of Si single crystal prefers to be deprived of a surface oxide film before the lattice-matching layer 302 is deposited as a film. The surface oxide film prefers to be removed because the presence thereof results in conspicuously inhibiting the crystal growth that reflects the (111) face of Si. As a means to remove the surface oxide film, such method as bias etching implemented in a vacuum device proves to be favorable.

When Hf, Mg or Zr is used for the lattice-matching layer 302, for the sake of enabling orientation of the (00•1) face of a hexagonal crystal system on the (00•1) orientation of Hf, Mg or Zr forming the lattice-matching layer 302, the difference in lattice constant prefers to be within 20%. So long as this difference falls in this range, the crystal directions can be lined up in the perpendicular direction of the bonding surface. The lattice constant of the hexagonal crystal system to be used for the second bonding layer 303, therefore, prefers to be in the range of $\alpha=2.58$ Å to 3.84 Å. Incidentally, since the orientation is (00•1), the lattice constant c may assume any magnitude.

The (111) face of the face centered cubic crystal system assumes a crystal face of the same pattern as the (00•1) face of a hexagonal crystal system as illustrated in FIG. 3. The value $1/\sqrt{2}$ of the lattice constant a of the face-centered crystal system equals the lattice constant a of the hexagonal crystal system. Since the difference in lattice constant prefers to be within 20% similarly to the case of the hexagonal crystal system, the lattice constant of the face-centered cubic crystal system to be used for the second bonding layer 303 prefers to fall in the range of $\alpha=3.65$ Å to 5.42 Å. When the lattice constant falls in this range, the crystal directions in the perpendicular direction of the bonding surface and in the in-plane direction of the bounding surface can be lined up on the lattice-matching layer 302.

The fact that the second bonding layer 303, for the same reason that applies to the first bonding layer 108, allows use of simple metals, such as Au, Ag, Ir, Pt, Pd, Rh, Ru, Re and Cu, or alloys containing two or more kinds of such simple metals proves to be favorable in consideration of the orientation with respect to the lattice-matching layer 302. When Cu is selected, the second bonding layer 303 can be obtained by depositing Au, for example, in the form of film on the lattice-matching layer 302 and thereafter depositing Cu in the form of film thereon.

While the case of using the lattice-matching layer 302 for the purpose of orienting the (111) face of the face-centered cubic structure of Au, Ag, Cu, Pt, Pd, Rh, Cu, Ir or the like or the (00•1) face of the hexagonal closest packing structure of Ru, Re or the like on the (111) face of Si has hitherto been described, the case of using an orientation-adjusting layer in the place of the lattice-matching layer 302 will be explained below.

The following procedure may be used for the purpose of enabling the (111) face of the face-centered cubic structure of Au, Ag, Cu, Pt, Pd, Rh, Cu, Ir or the like or the (00•1) face of the hexagonal closest packing structure of Ru, Re or the like to be grown on the (111) face of Si.

That is, the growth is implemented by thoroughly cleaning the surface of the silicon single crystal substrate (electroconductive substrate 301) possessing a (111) face as by RCA cleaning, then subjecting the cleaned surface to hydrogen termination as with dilute hydrofluoric acid and thereafter effecting deposition of film by using a film-forming device provided with an extremely high degree of vacuum. By preferably fixing the concentration of the dilute hydrofluoric acid in the approximate range of 0.1 to 2 wt % and performing the treatment for a period in the approximate range of 1 to 20 min., it is made possible to accomplish the hydrogen termination of the surface of the silicon single crystal substrate possessing a (111) face. The final degree of vacuum attained in the vacuum device prefers to be as high as possible because the occurrence of impure gas, such as oxygen or nitrogen, during the course of film deposition results in preventing the cleaned surface from being kept intact. The degree of vacuum finally attained in the vacuum device is preferably in the range of $1.0\times10^{-4}$ Pa to $1.0\times10^{-8}$ Pa and more preferably $5.0\times10^{-5}$ Pa to $1.0\times10^{4}$ Pa. Though the ease with which the epitaxial growth is attained increases in proportion as the degree of vacuum increases, the effort of enabling the vacuum device to attain $1.0\times10^{-8}$ Pa entails such disadvantages as requiring the device to be provided with an exhaust system having a large capacity of exhaustion and requiring the vacuum device to be subjected to a baking treatment for a long time. When the surface of the silicon single crystal substrate possessing a (111) face has undergone hydrogen termination, good epitaxial growth can be realized under such a high degree of vacuum as preferably exceeding $1.0\times10^{-4}$ Pa and more preferably exceeding $5.0\times10^{-5}$ Pa.

In the metals mentioned above, Ag and Si form no silicide and, therefore, can realize most easily good epitaxial growth on the surface of a silicon single crystal substrate possessing a (111) face.

It is generally held that when the (111) face of Si possesses a 7×7 structure, Ag attains epitaxial growth on the (111) face. This epitaxial growth, however, is at a disadvantage in lacking production efficiency because the silicon single crystal substrate is required to undergo a treatment under an ultrahigh degree of vacuum of about $1.0 \times 10^{-8}$ Pa at a high temperature of about 1200° C. for the purpose of realizing the 7×7 structure of (111) face. By using the procedure of this invention, it is made possible to attain epitaxial growth of Ag or an Ag alloy on the (111) face even in accordance with deposition of film at normal room temperature.

Though Ag as a simple metal suffices for the sole purpose of attaining epitaxial growth on the (111) surface of Si, it is allowed to add Cu, Nd, Mo, C, In, Sn or the like for the purpose of enhancing the adhesiveness with the Si single crystal substrate and the heat resistance of Ag.

As a means to deposit Ag in the form of film, any of the methods, such as the sputtering method, vapor deposition method, MBE method and Pulse Laser Deposition (PLD) method, that attain the deposition of film in vacuum may be used. It is, however, more favorable to use the sputtering method because it produces a high degree of vacuum relatively easily and excels in production efficiency.

The deposition of film may be implemented at room temperature or at an elevated temperature, whichever suits the occasion better.

In the case of depositing Ag as a film on the surface of a silicon single crystal substrate possessing a (111) face, the deposited film may be used without any modification as a bonding layer. For the purpose of obtaining this bonding layer, however, it is more favorable to use Au, Pt, Pd, Rh, Ir, Ru or Re which is oxidized less easily than Ag. It is more favorable to use Au. In this case, Ag and Au inevitably induce mutual diffusion because they are wholly converted into a solid solution. For the purpose of preventing this mishap, it is effective to use a mutual diffusion-preventing layer on the Ag layer. Since this formation of the mutual diffusion-preventing layer necessitates epitaxial growth of Au, it is necessary that the simple metal or the alloy forming the mutual diffusion-preventing layer possess a lattice structure and a lattice constant $\alpha$=2.53 Å to 3.79 Å in the case of a hexagonal crystal system or $\alpha$=3.58 Å to 5.36 Å in the case of a face-centered cubic crystal system. Thus, the mutual diffusion-preventing layer allows use of Pt, Ru, Re, Os, Rh, Ir, Pd, Ti (hexagonal closest packing structure, $\alpha$=2.95 Å), Hf (hexagonal closest packing structure, $\alpha$=3.20 Å), or Zr (hexagonal closest packing structure, $\alpha$=3.23 Å), or the like.

As a means to deposit the ohmic contact layer 106, reflecting layer 107, mutual diffusion-preventing layer and first bonding layer 108 that form the first stacked body and the lattice-matching layer 302, orientation-adjusting layer, mutual diffusion-preventing layer and second bonding layer 303 that form the second stacked body 300, known methods of deposition, such as vapor deposition method, sputtering method and Chemical Vapor Deposition (CVD) method are available.

The reflecting layer 106, mutual diffusion-preventing layer and first bonding layer 108 that form the first stacked body 100 and the lattice-matching layer 302, orientation-adjusting layer, mutual diffusion-preventing layer and second bonding layer that form the second stacked body 300 do not need to be particularly restricted in terms of film thickness. For the sake of imparting good crystallinity, however, they prefer to measure 1 nm or more each. Since the deterioration of crystallinity in consequence of addition to film thickness does not occur particularly, the upper limit of the film thickness is not defined. From the viewpoint of productivity, however, the upper limit prefers to be 10 μm or less.

FIG. 5 is a schematic view depicting the step of bonding the first stacked body and the second stacked body. Two bonding samples 402 (the first stacked body 100 and the second stacked body 300) are severally attached to two substrate holders 401, the surfaces of these bonding samples 402 (the bonding surface of the first bonding layer 108 and the bonding surface of the second bonding layer 303) are irradiated with an inert gas ion beam from inert gas ion beam sources 403 or an inert gas neutral atom beam from inert gas neutral atom beam sources 403 (FIG. 5(A)), and thereafter the respective bonding surfaces of the bonding samples 402 are placed on top of each other (FIG. 5(B)).

The bonding may be accomplished by any method that bonds the surfaces of the bonding layers in vacuum while the surfaces are kept in an activated state (the state having the dangling bond exposed). It is nevertheless preferable to have the bonding surfaces placed on top of each other after the surfaces are irradiated with the inert gas ion beam or inert gas neutral atom beam as mentioned above.

Since a certain duration (one sec. to 60 sec., for example) is required after the time of irradiating the bonding surfaces with the inert gas ion beam or inert gas neutral atom beam and before the time of placing the bonding surfaces on top of each other, the possibility that the surfaces of the bonding layers will be contaminated in consequence of re-adhesion of the gas is undeniable. It is, therefore, favorable to decrease the amount of impure gas by keeping the final degree of vacuum in the vacuum device at a level of $10^{-4}$ Pa or less, preferably $10^{-5}$ Pa or less.

The pressurization performed during the course of bonding is favorable because it results in enhancing the strength of bonding. The degree of pressurization prefers to be in the range of 0.1 MPa to 100 MPa. If this degree falls short of 0.1 MPa, the pressure will be too weak to attain a sufficient strength of bonding. If the degree exceeds 100 MPa, the pressure will possibly inflict damage on the substrate. More preferably, the degree is in the range of 1 MPa to 10 MPa.

As the inert gas, any gas can be used so long as it is inert in quality. It is nevertheless favorable to use He, Ne, Ar, Kr or Xe. Particularly, Ar is further favorable because it can be procured at a low cost.

The heat applied during or after the course of bonding is favorable for the sake of enhancing the strength of bonding. The temperature reached by this heating prefers to be 200° C. or less when the substrate 101 is formed of sapphire and the electroconductive substrate 301 is formed of silicon single crystal because sapphire and silicon have a large difference in thermal expansion coefficient.

For the purpose of lowering the bonding strength during the course of bonding and the component of resistance in the interface of bond, it suffices that the first bonding layer 108 and the second bonding layer 303 are equal in crystal structure. It is nevertheless more favorable that the difference in lattice constant between the first bonding layer 108 and the second bonding layer 303 is within 5%. It is still more favorable that the first bonding layer 108 and the second bonding layer 303 are equal in kind of substance. When the first bonding layer 108 is formed of Au and possesses a crystal orientation of (111) in the perpendicular direction of bonding surface, for example, it is favorable that the second bonding layer 303 is also formed of Au and also possesses a crystal orientation of (111) in the perpendicular direction of bonding surface.

The first stacked body 100 is stripped of the substrate 101 after the first stacked body 100 and the second stacked body 300 are bonded. As a means to remove the substrate 101, any of the known techniques, such as polishing, etching and laser liftoff, can be used without any restriction. When the laser liftoff method is adopted, it is favorable to use the KrF excimer laser (wavelength 248 nm) or the ArF excimer laser (wavelength 193 nm).

After the removal of the substrate, the buffer layer (GaN layer 102) is removed as by the polishing or etching method to expose the n-type semiconductor layer 103.

Figure 6:
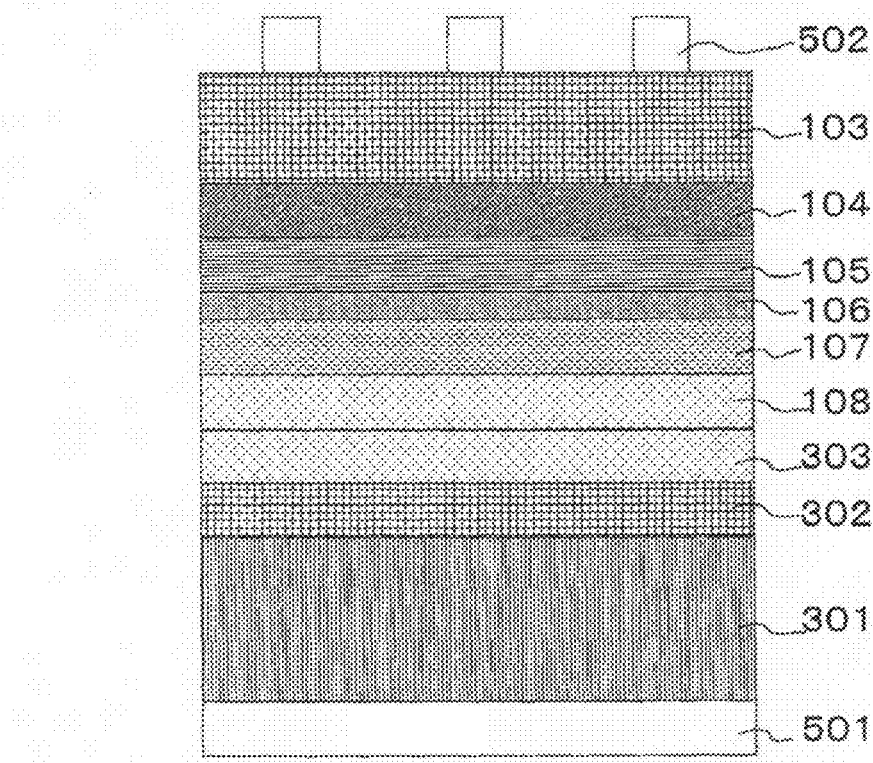
FIG. 6 is a schematic cross section illustrating what results from forming a positive electrode and a negative electrode on the product of bonding subsequent to removing the substrate by peeling.

Then, a negative electrode 502 is formed on the n-type semiconductor layer 103 and a positive electrode 501 is formed on the back surface of the electroconductive substrate 301 as illustrated in FIG. 6.

As the negative electrode 502, negative electrodes of various compositions and structures have been known. Any of these known negative electrodes can be adopted without any restriction.

As the positive electrode 501, various structures using materials, such as Au, Al, Ni and Cu, have been publicly known. Any of these known materials can be adopted without any restriction.

Figure 7:
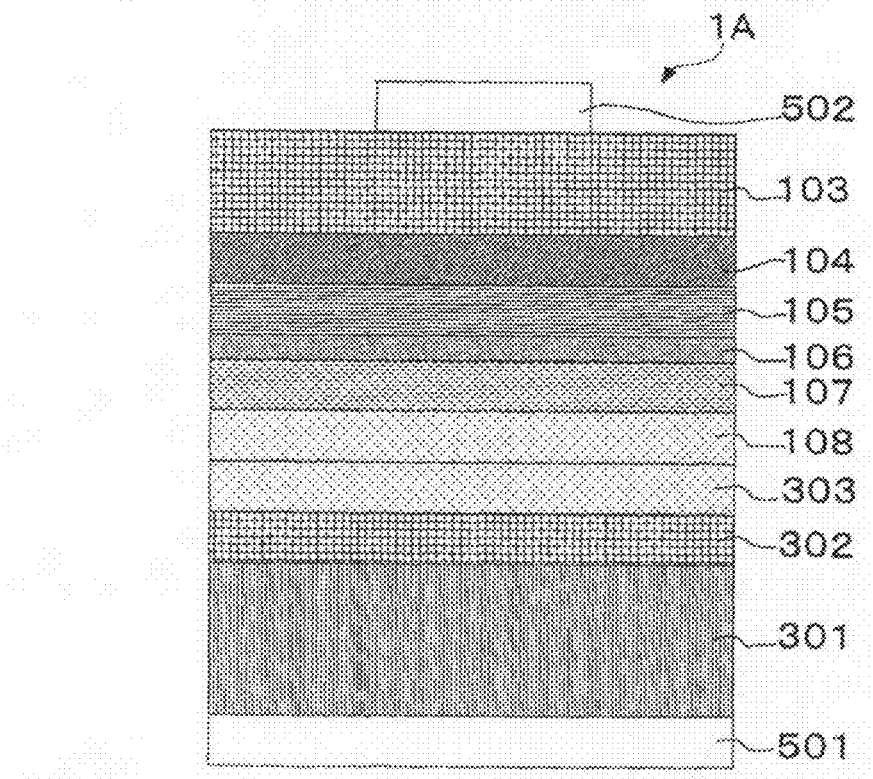
FIG. 7 is a schematic cross section illustrating a GaN-based semiconductor light-emitting device in the finished state.

After the formation of the negative electrode 502 and the positive electrode 501, the devices produced collectively in a wafer are partitioned to finally obtain the GaN-based semiconductor light-emitting devices 1A of this invention as illustrated in FIG. 7. As a means to effect this partitioning, any of the publicly known techniques, such as the laser scribe method and the dicing method, can be used without any restriction.

Next, the case of configuring a lamp by using the GaN-based semiconductors as described above will be described.

Figure 8:
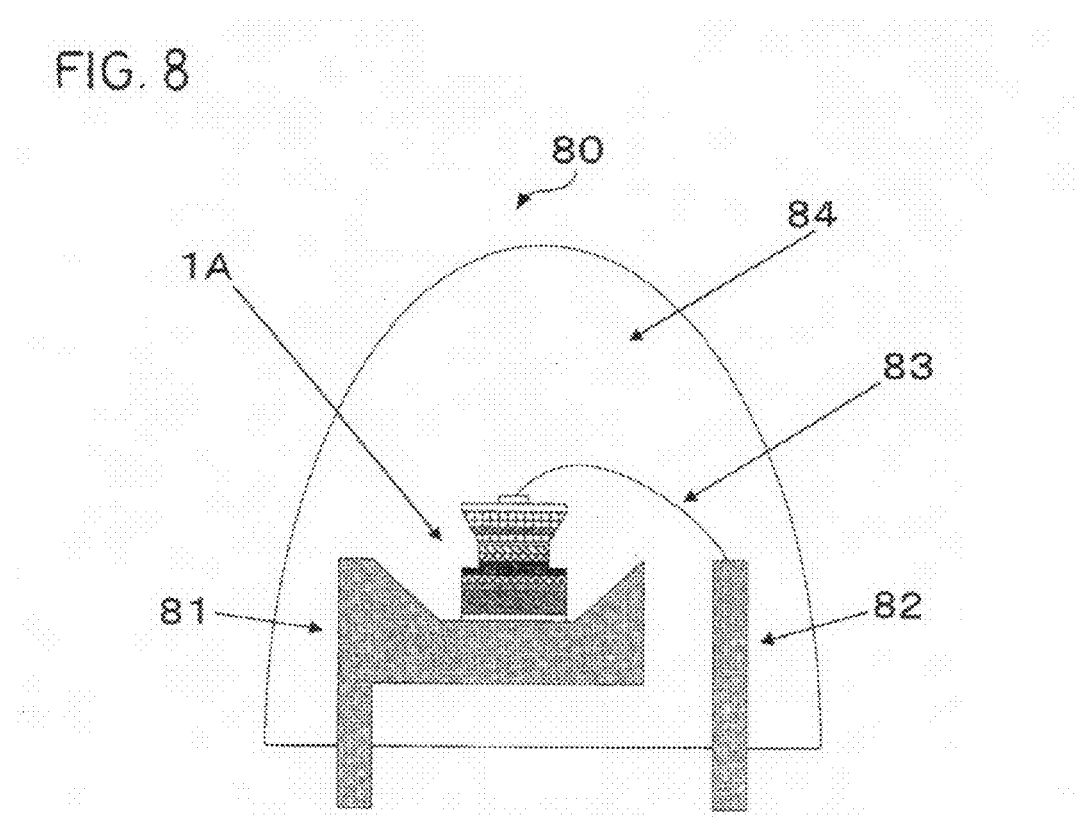
FIG. 8 is a schematic cross section illustrating one example of a lamp of this invention.

FIG. 8 is a schematic cross section illustrating one example of the lamp of this invention. A lamp 80 shown in FIG. 8 has resulted from processing the upper and lower electrode-type GaN-based semiconductor device 1A of this invention in the shape of a (tapered) shell and mounting this shell in position. It can be manufactured by any of the publicly known methods. To be more specific, it can be formed by adhering the positive electrode 501 of the GaN-based semiconductor light-emitting device 1A with an electroconductive adhesive agent, such as silver paste, to a frame 81 which is one of the pair of frames 81 and 82 and the negative electrode 502 of the GaN-based semiconductor light-emitting device 1A with a wire 83 made of gold to the frame 82 and thereafter molding the periphery of the GaN-based semiconductor light-emitting device 1A with a mold 84 made of transparent resin.

Now, Examples of this invention will be described in detail below by reference to FIG. 9 to FIG. 14. The invention nevertheless does not need to be limited only to these Examples.

Example 1

Figure 9:
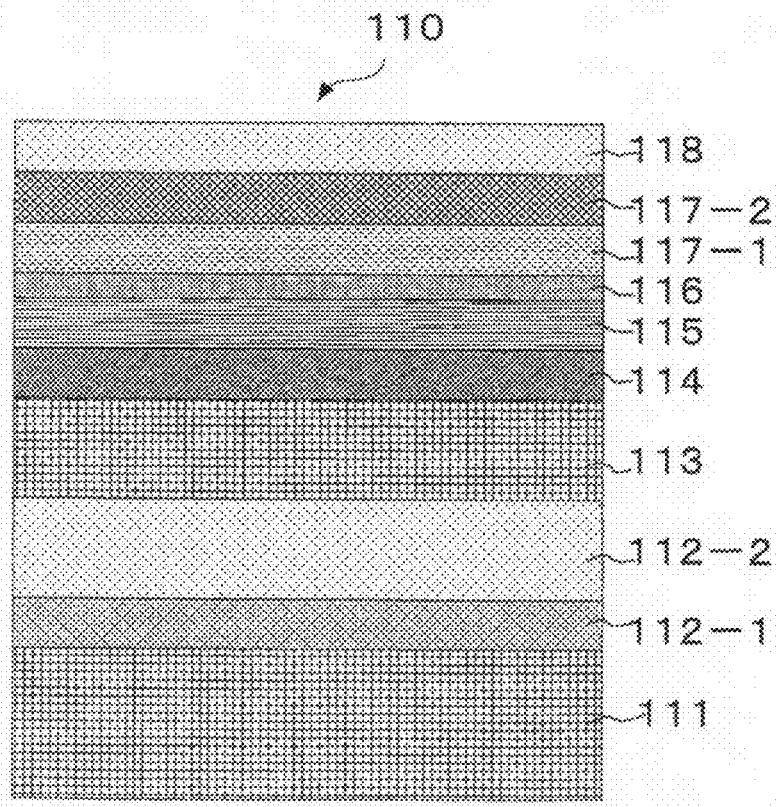
FIG. 9 is a schematic cross section illustrating the first stacked body of Example 1.

On a substrate 111 formed of sapphire single crystal, a gallium nitride (GaN)-based compound semiconductor layer was stacked via a buffer layer 112-1 formed of AlN as illustrated in FIG. 9. This gallium nitride-based compound semiconductor layer was composed of an n-type semiconductor layer 113 resulting from stacking an undoped under layer 112-2 of GaN having a thickness of 4 μm, a Ge-doped n-type contact layer having a thickness of 2 μm and an n-type $In_{0.1}Ga_{0.9}N$ clad layer having a thickness of 0.02 μm in the order mentioned, a light-emitting layer 114 of multiple quantum well structure resulting from stacking five cycles each consisting of an Si-doped GaN barrier layer having a thickness of 16 nm and an $In_{0.06}Ga_{0.94}N$ well layer having a thickness of 2.5 nm and finally disposing a barrier layer thereon, and a p-type semiconductor layer 115 resulting from stacking an Mg-doped p-type $Al_{0.07}Ga_{0.93}N$ clad layer having a thickness of 0.01 μm and an Mg-doped p-type $Al_{0.02}Ga_{0.98}N$ contact layer having a thickness of 0.18 μm in the order mentioned and was formed by having these component layers stacked in the order mentioned.

In the configuration consequently obtained, the n-type GaN contact layer had a carrier concentration of $1 \times 10^{19}$ $cm^{-3}$, the GaN barrier layer had an Si-doping content of $1 \times 10^{17}$ $cm^{-3}$, the p-type AlGaN contact layer had a carrier concentration of $5 \times 10^{18}$ $cm^{-3}$, and the p-type AlGaN clad layer had an Mg-doping content of $5 \times 10^{19}$ $cm^{-3}$.

The component layers 112-2, 113, 114 and 115 of the GaN-based compound semiconductor layer were stacked by the MOCVD method under the ordinary conditions well known in the pertinent technical field.

Next, on the p-type semiconductor layer 115, a Pt layer having a thickness of 1.5 nm was deposited as an ohmic contact layer 116 by the sputtering method.

Then, a first stacked body 110 was obtained by having Ag deposited as a reflecting layer 117-1 in a thickness of 20 nm, Pt as a mutual diffusion-preventing layer 117-2 in a thickness of 20 nm, and Au as a first bonding layer 118 in a thickness of 20 nm in the order mentioned by the sputtering method.

Figure 10:
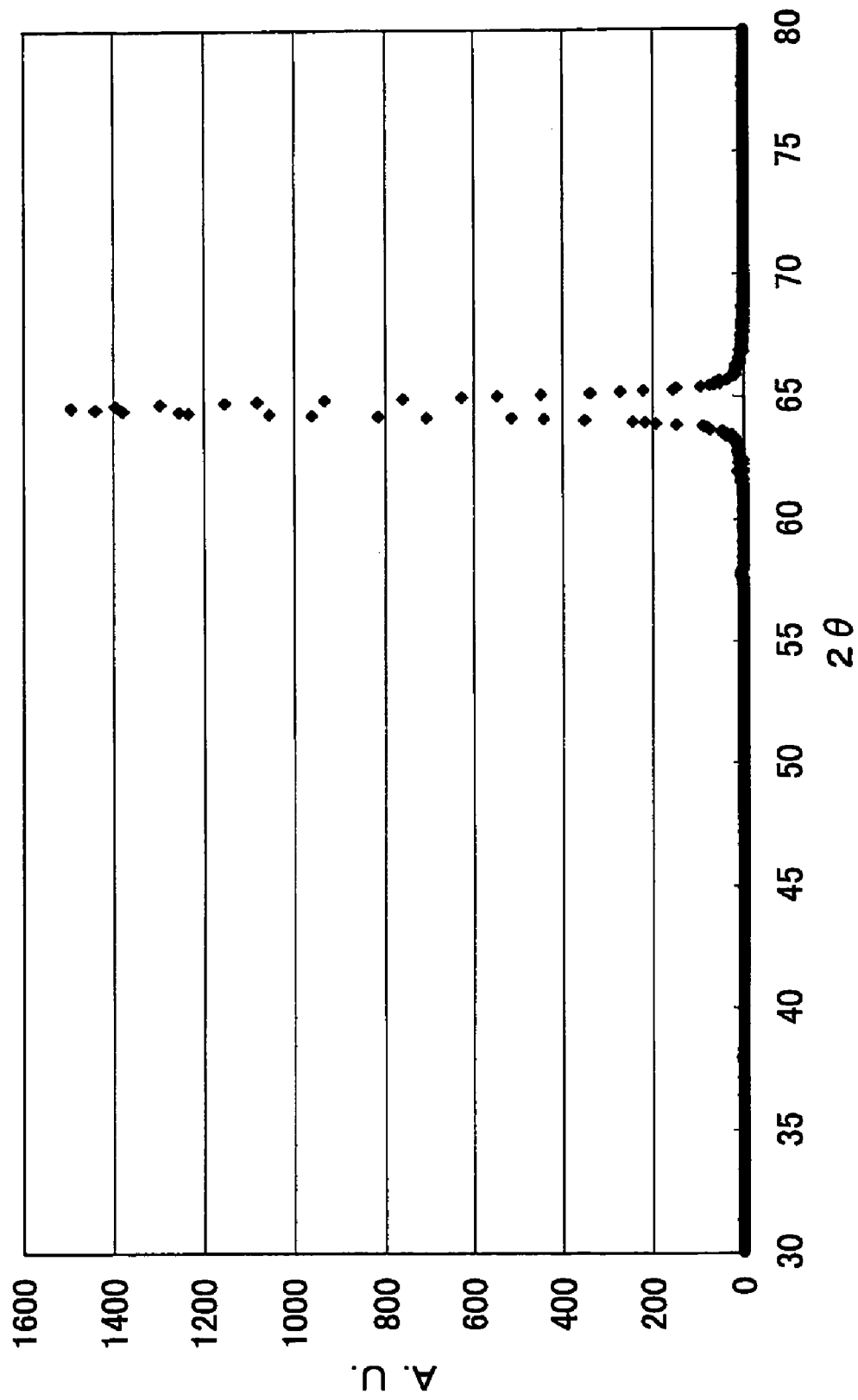
FIG. 10 is a diagram showing the results of the 2θ/φ determination of the first bonding layer in Example 1.
Figure 11:
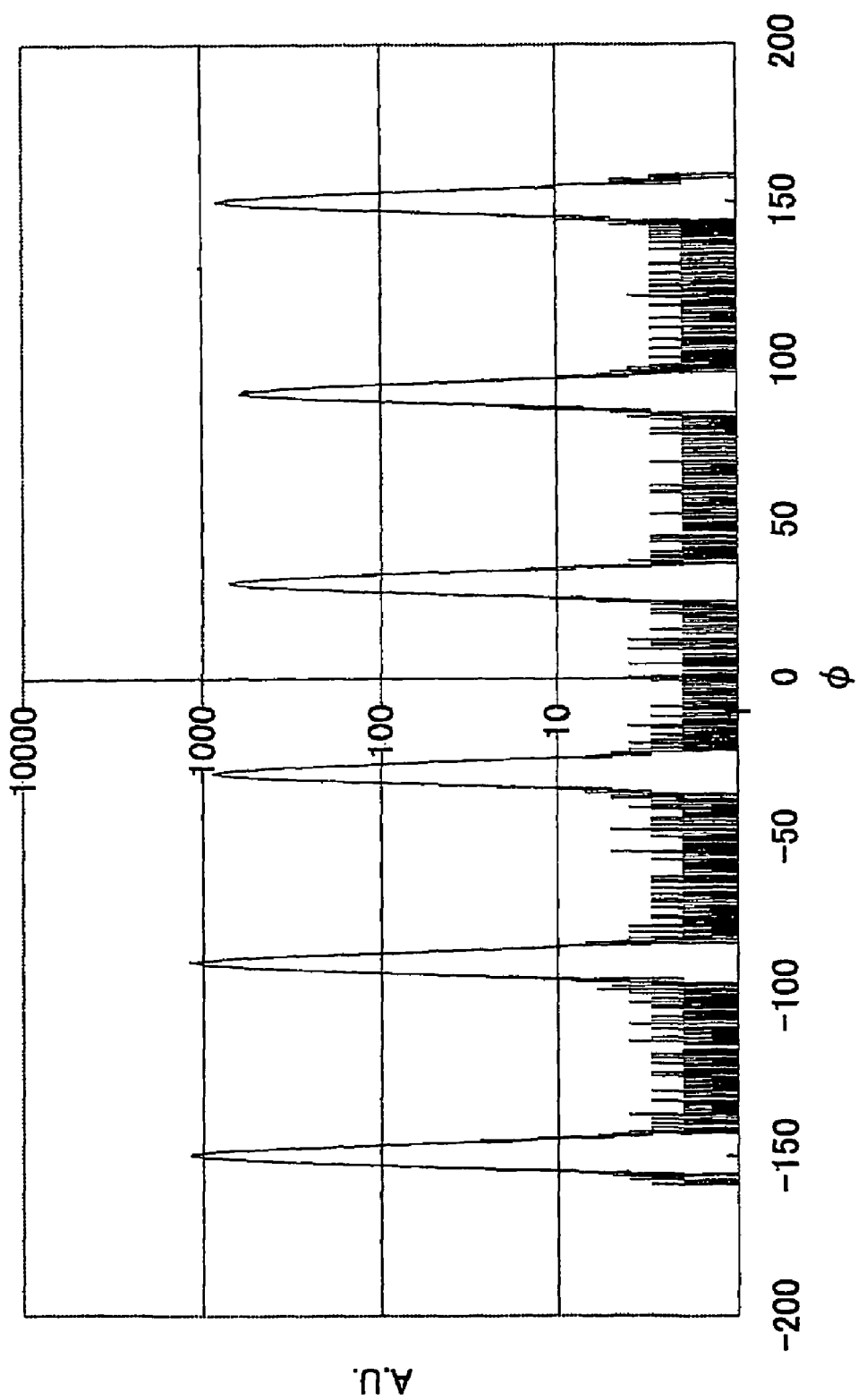
FIG. 11 is a drawing showing the results of the q) determination carried out with 2θ fixed at the Au (220) peak in FIG. 10.
Figure 12:
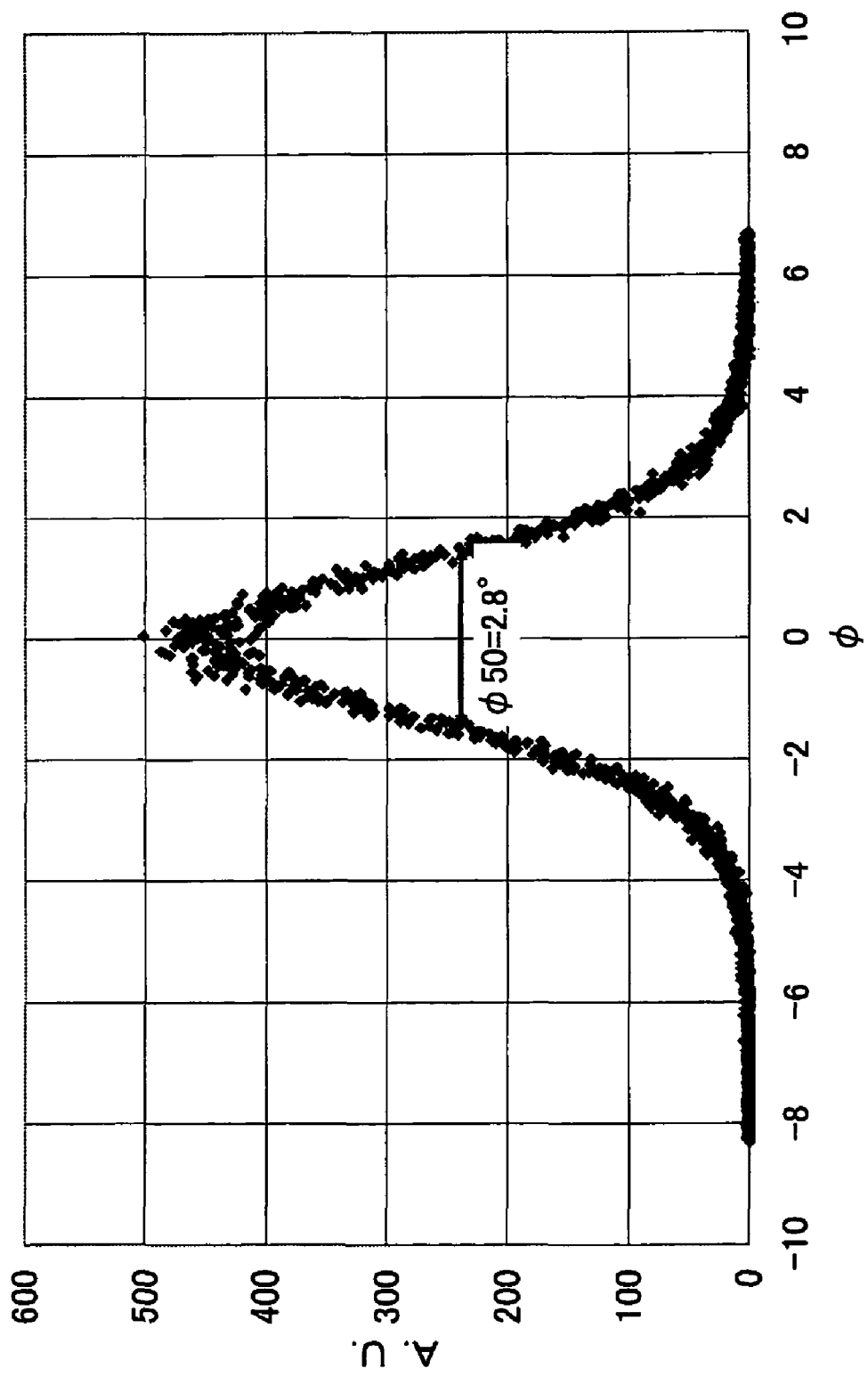
FIG. 12 is a diagram showing the details of one peak in FIG. 11 and depicting the peak half-value width (φ 50) in the first bonding layer.
Figure 13:
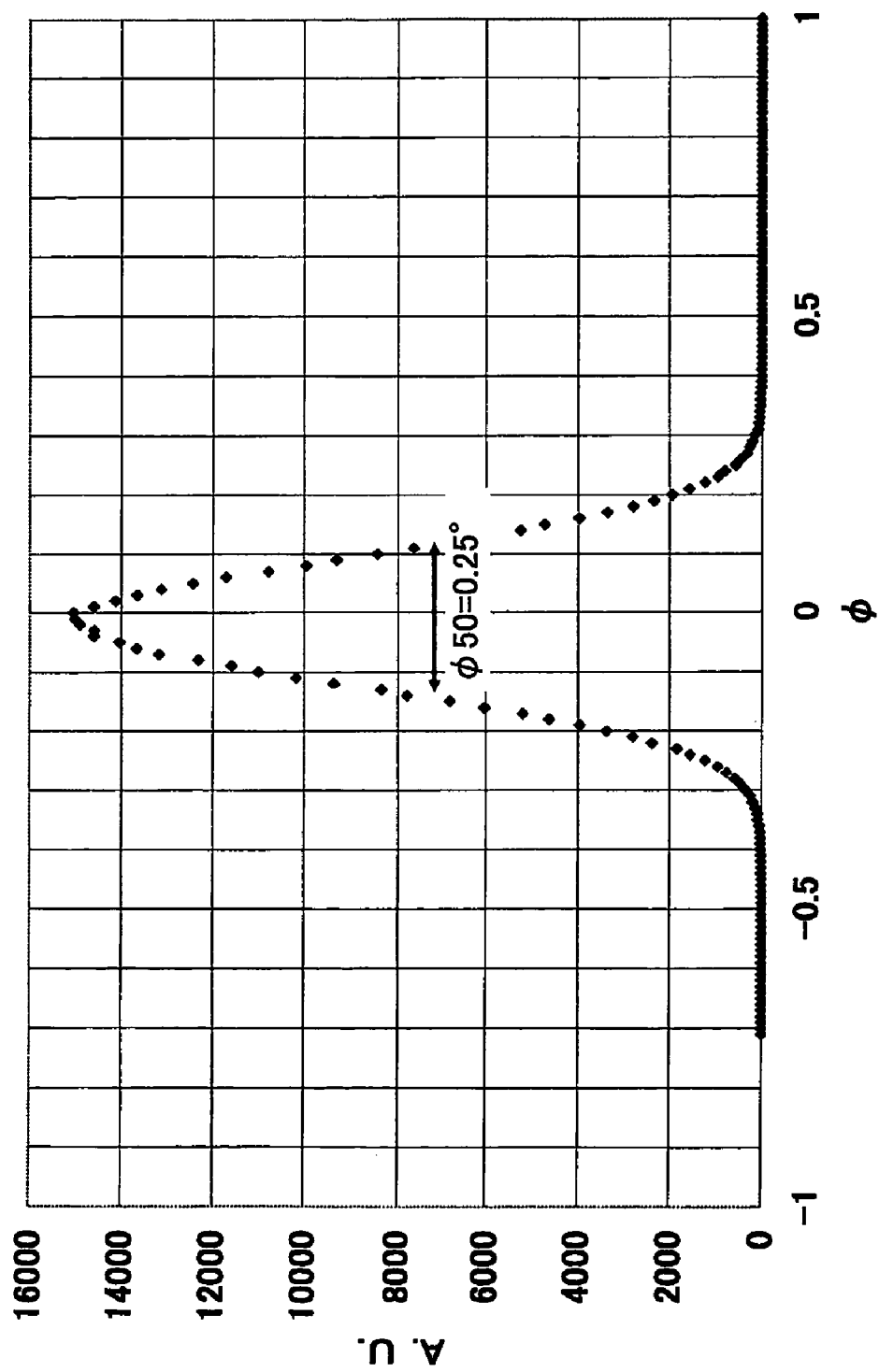
FIG. 13 is a diagram illustrating the peak half-value width (φ 50) in the p-type GaN-based layer in the first stacked body of Example 1.

The first stacked body 110 was subjected to in-plane X-ray measurement with a view to determining the orientation of the first bonding layer 118. The results of the determination of 2θ/φ are shown in FIG. 10. Referring to FIG. 10, the abscissa axis plots 2θ and the ordinate axis plots A.U. (arbitrary unit), i.e. the value obtained by dividing the number of counts found with an X-ray detector by the time. Since an Au (220) peak is confirmed in FIG. 10, it may be safely concluded that the Au (111) orientation occurred in the perpendicular direction of the surface. FIG. 11 shows the results of the φ determination carried out, with 2θ fixed at the Au (220) peak. Referring to FIG. 11, the abscissa axis plots φ and the ordinate axis plots A.U. FIG. 11 shows six equidistantly separated peaks and clearly indicates hexagonal axis of symmetry. This fact allows safe inference that Au was epitaxially grown on the p-type contact layer. The results of a further detailed study on one of the peaks of FIG. 11 are shown in FIG. 12. The half-value width ((φ50) of the peak is 2.8°, a value that is large as compared with the value of 0.25° found for the p-type GaN layer and shown in FIG. 13. This fact may be explained by supposing that Au was converted to polycrystal and consequently induced to impart slight turbulence to the orientation.

Figure 14:
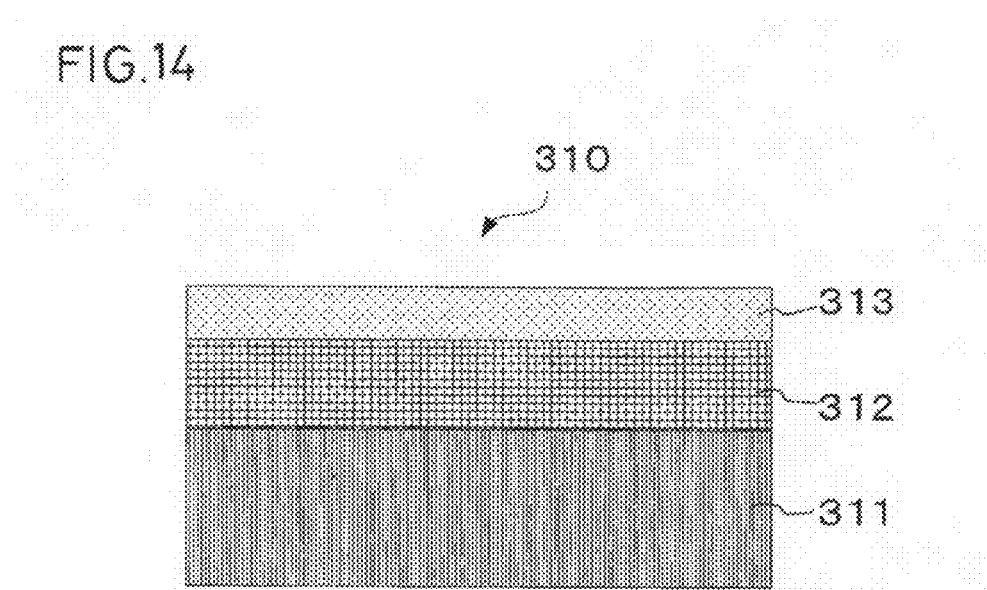
FIG. 14 is a schematic cross section illustrating the second stacked body of Example 1.

Next, on an electroconductive substrate 311 formed of Si single crystal possessing a (111) face as the surface thereof. Hf was deposited as a lattice-matching layer 312 in a thickness of 20 nm and Au as a second bonding layer 313 in a thickness of 20 nm in the order mentioned by the sputtering method as illustrated in FIG. 14. Incidentally, before Hf of the lattice-matching layer 312 was deposited on the electroconductive substrate 311, a surface oxide film was removed from the upper side of the electroconductive substrate 311 in a sputtering device by bias etching.

Next, the first stacked body 110 and the second stacked body 310 were bonded in a vacuum device while the respective bonding surfaces of the first bonding layer 118 and the second bonding layer 313 were placed on top of each other. At this time, with the final degree of vacuum in the vacuum device set at $1.0 \times 10^{-5}$ Pa, both the bonding surfaces were irradiated with an Ar gas neutral atom beam for one minute and bonded by application of a pressure of 5 MPa. No heat treatment was performed during and before and after the course of bonding.

Then, from the body resulting from bonding the first stacked body 110 and the second stacked body 310, the substrate 111 was removed by the laser liftoff method. The laser liftoff was implemented with an ArF excimer laser, with the laser radiation area per shot set at 700 μm×700 μm and the energy density at 1000 mJ/cm$^2$.

Next, the n-type semiconductor layer 113 was exposed by removing the buffer layer 112-1 formed of AlN and the undoped under layer 112-1 formed of GaN by the dry etching method.

Then, on the surface of the n-type semiconductor layer 113, an ITO (SnO$_2$: 10 wt %) 512-1 was deposited by vapor deposition in a thickness of 400 nm. Subsequently, in the central part on the surface of the IT 512-1, a negative electrode 512-2 formed of Cr (40 nm), Ti (100 nm) and Au (1000 nm) was deposited by vapor deposition. The negative electrode 512-2 was patterned by the technique of photolithography and the technique of liftoff both known to the public.

Further, on the surface of the electroconductive substrate 311, a positive electrode 511 formed of Au (1000 nm) was deposited by the vapor deposition method.

Figure 15:
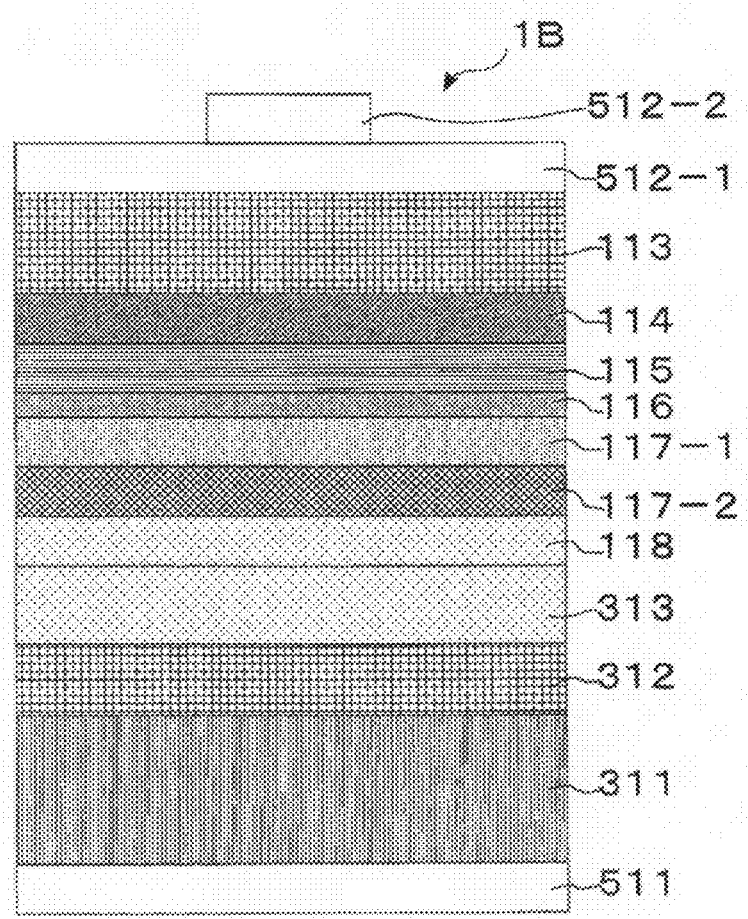
FIG. 15 is a schematic cross section illustrating the GaN-based semiconductor light-emitting device of Example 1 in the finished state.

Then, the wafer consequently produced was partitioned by dicing to obtain GaN-based semiconductor light-emitting devices 1B each measuring the square of 350 μm as illustrated in FIG. 15.

Method of evaluation: The GaN-based semiconductor light-emitting device 1B was mounted in a TO-18 can package and tested for light emission output Po at an applied current of 20 mA and for operating voltage Vf as well.

For the purpose of determining the property of adhesion, the wafer prior to being partitioned by dicing into the GaN-based semiconductor light-emitting devices was tested for the property of film separation. For this test, the accelerated test resulting from combining the method specified in JIS (Japanese Industrial Standard) (JIS H8062-1992) with the heat shock test was adopted.

First, in the wafer prior to being partitioned by dicing into the GaN-based semiconductor light-emitting devices, linear scratches were incised at intervals of 1 mm in a grid pattern with a cutter knife. The scratches were formed in a depth reaching the surface of the electroconductive substrate 311. Subsequently, the wafer was heated in an oven kept at 400° C. for 30 min., suddenly cooled in water to a temperature of 20° C. and dried.

Then, an adhesive tape (cellophane tape 12 mm in width, made by Nichiban Co., Ltd.) was applied to the surface parts of the GaN-based semiconductor light-emitting devices defined by the inscription of scratches and readied for partitioning by dicing, made to adhere closely to the surface parts without leaving any gap behind, and peeled off the surface parts. In this case, of the total of 100 sections of the light-emitting device surface each measuring the square of 1 mm that had been partitioned with the scratches, the number of sections surviving the peeling was counted. When the surviving sections totaled 100, the absence of film separation could be announced.

Example 2

On the substrate 111 formed of sapphire single crystal, the component layers, namely the buffer layer 112-1, under layer 112-2, n-type semiconductor layer 113, light-emitting layer 114 and p-type semiconductor layer 115, were stacked in the order mentioned in the same manner as in Example 1.

Figure 16:
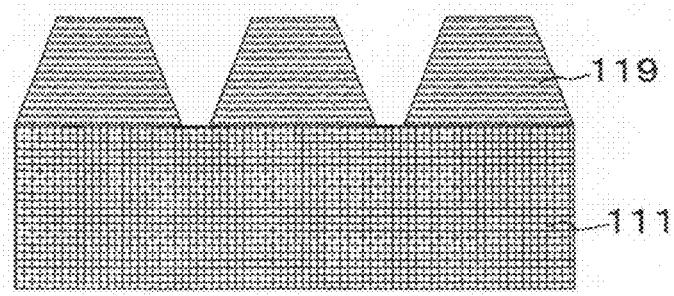
FIG. 16 is an explanatory view of the tapering work in Example 2.

Then, the component layers of GaN-based semiconductor ranging from the p-type semiconductor layer 115 to the buffer layer 112-1 were dug by dry etching in accordance with the publicly known method of photolithography to effect partitioning as illustrated in FIG. 16. At this time, by forming a resist in a tapered shape, the side faces of the component layers on the substrate 111 were formed likewise in a tapered shape, with the result that a tapered layer 119 was produced.

Next, on the p-type semiconductor layer 115 constituting the surface of the tapered layer 119, a Pt layer was deposited in a thickness o 1.5 nm as the ohmic contact layer 116 by the sputtering method and Ag was deposited in a thickness of 20 nm as the reflecting layer 117-1, Pt in a thickness of 20 nm as the mutual diffusion-preventing layer 117-1, and Au in a thickness of 20 nm as the first bonding layer 118 in the order mentioned by the sputtering method. The first stacked body was obtained by having the ohmic contact layer, reflecting layer, mutual diffusion-preventing layer and first bonding layer deposited by the publicly known method of photolithography on the p-type semiconductor layer.

Thus, the first stacked body of Example 2 differed from the first stacked body 110 of Example 1 in having the component layers ranging from the buffer layer 112-1 to the p-type semiconductor layer 115 form the tapered layer 119.

Figure 17:
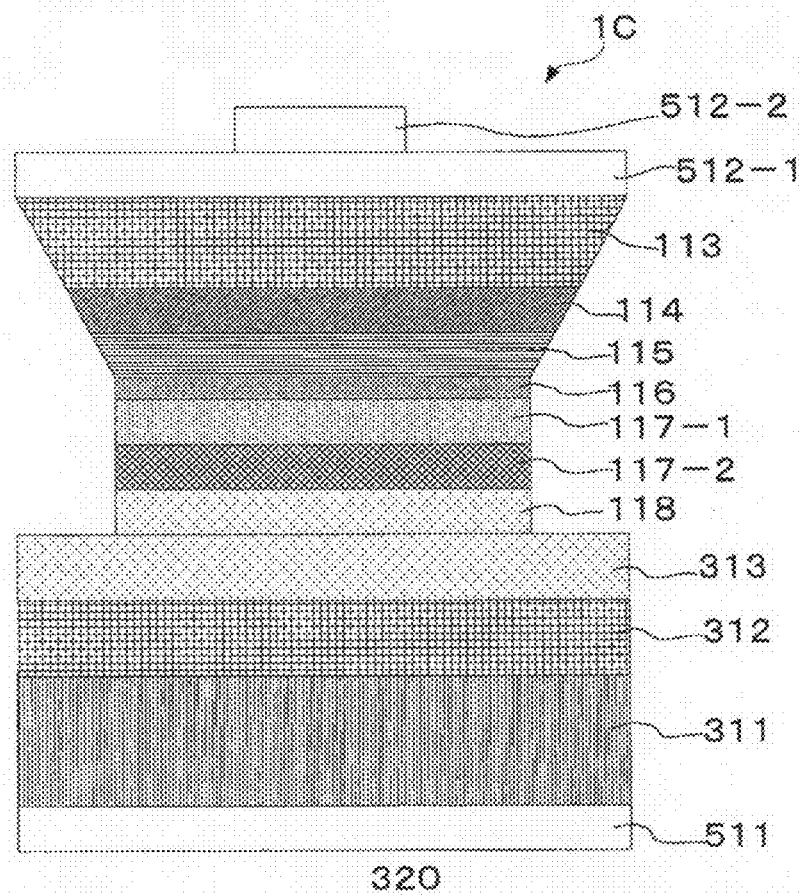
FIG. 17 is a schematic cross section illustration the GaN-based semiconductor light-emitting device of Example 2 in the finished state.

The second stacked body was manufactured in the same manner as in Example 1 described above. Subsequently, the bonding of the first stacked body and the second stacked body, the removal of the substrate, the buffer layer, and the under layer from the first stacked body (the exposure of the n-type semiconductor layer), and the formation of electrodes were implemented in the same manner as in Example 1. As a result, the GaN-based semiconductor light-emitting devices 1C that each measured the square of 350 μm were finally manufactured as illustrated in FIG. 17.

The GaN-based semiconductor light-emitting devices 1C obtained consequently were rated for light emission output Po, operating voltage Vf and the property of adhesion by following the procedure of Example 1.

The main production conditions of Example 1 and Example 2 and the results of evaluation (light emission output Po, operating voltage Vf and number of sections surviving the peeling test) are shown in Table 1 below.

TABLE 1

| | Reflecting layer | | Mutual diffusion-preventing layer | | First bonding layer | | | Second bonding layer | | | Lattice-matching layer | | | | Number of sections surviving peeling test |
|---|---|---|---|---|---|---|---|---|---|---|---|---|---|---|---|
| | Composition | Thickness (nm) | Composition | Thickness (nm) | Composition | Thickness (nm) | Orientation | Composition | Thickness (nm) | Orientation | Composition | Thickness (nm) | Po (mW) | Vf (V) | |
| Ex. 1 | Ag | 20 | Pt | 20 | Au | 20 | (111) | Au | 20 | (111) | Hf | 20 | 12 | 3.0 | 100 |
| Ex. 2 | Ag | 20 | Pt | 20 | Au | 20 | (111) | Au | 20 | (111) | Hf | 20 | 17 | 3.1 | 100 |

TABLE 1-continued

| | Reflecting layer | | Mutual diffusion-preventing layer | | First bonding layer | | | Second bonding layer | | | Lattice-matching layer | | | | Number of sections |
|---|---|---|---|---|---|---|---|---|---|---|---|---|---|---|---|
| | Composition | Thickness (nm) | Composition | Thickness (nm) | Composition | Thickness (nm) | Orientation | Composition | Thickness (nm) | Orientation | Composition | Thickness (nm) | Po (mW) | Vf (V) | surviving peeling test |
| Ex. 3 | Al | 20 | None | | Au | 20 | (111) | Au | 20 | (111) | Hf | 20 | 15 | 3.1 | 100 |
| Ex. 4 | Ag | 20 | Pt | 20 | Au | 20 | (111) | Au | 20 | (111) | Zr | 20 | 17 | 3.2 | 100 |
| Ex. 5 | Ag | 20 | Pt | 20 | Au | 20 | (111) | Au | 20 | (111) | Mg | 20 | 17 | 3.1 | 100 |
| Ex. 6 | Ag | 20 | None | | Ag | 20 | (111) | Ag | 20 | (111) | Hf | 20 | 16 | 3.2 | 100 |
| Ex. 7 | Ag | 20 | None | | Pt | 20 | (111) | Pt | 20 | (111) | Hf | 20 | 16 | 3.2 | 100 |
| Ex. 8 | Ag | 20 | Pt | 20 | Pd | 20 | (111) | Pd | 20 | (111) | Hf | 20 | 16 | 3.2 | 100 |
| Ex. 9 | Ag | 20 | None | | Rh | 20 | (111) | Rh | 20 | (111) | Hf | 20 | 17 | 3.3 | 100 |
| Ex. 10 | Ag | 20 | None | | Ir | 20 | (111) | Ir | 20 | (111) | Hf | 20 | 16 | 3.2 | 100 |
| Ex. 11 | Ag | 20 | None | | Ru | 20 | (00·1) | Ru | 20 | (00·1) | Hf | 20 | 17 | 3.2 | 100 |
| Ex. 12 | Ag | 20 | None | | Re | 20 | (00·1) | Re | 20 | (00·1) | Hf | 20 | 16 | 3.2 | 100 |
| Ex. 13 | Ag | 20 | Pt | 20 | Au | 20 | (111) | Ag | 20 | (111) | Hf | 20 | 16 | 3.4 | 100 |
| Ex. 14 | Ag | 20 | Pt | 20 | Au | 20 | (111) | Pt | 20 | (111) | Hf | 20 | 16 | 3.5 | 100 |
| Comp. Ex. 1 | Ag | 20 | Pt | 20 | Au | 20 | (111) | | None | | | None | | | 0 |
| Comp. Ex. 2 | Ag | 20 | None | | Pt | 20 | (111) | Pt | 20 | (111) + (200) | | None | 16 | 3.5 | 65 |
| Comp. Ex. 3 | Ag | 20 | Pt | 20 | Cu | 20 | (111) | Au | 20 | (111) | Hf | 2 | 16 | 3.7 | 70 |
| Comp. Ex. 4 | Ag | 20 | Pt | 20 | Cr | 20 | (200) + (110) | Cr | 20 | (200) + (110) | Hf | 2 | 15 | 3.8 | 49 |

Examples 3 to 14

A GaN-based semiconductor light-emitting device was fabricated by following the procedure of Example 2 while having a reflecting layer, mutual diffusion-preventing layer, first bonding layer, second bonding layer and lattice-matching layer changed under the conditions shown in Table 1 above and evaluated in the same manner as in Example 2.

Comparative Examples 1 to 4

A GaN-based semiconductor light-emitting device was fabricated by following the procedure of Example 2 while having a reflecting layer, mutual diffusion-preventing layer, first bonding layer, second bonding layer and lattice-matching layer changed under the conditions shown in Table 1 above and evaluated in the same manner as in Example 2.

As illustrated in Example 1, a GaN-based semiconductor light-emitting device allowing no peeling and exhibiting a low operating voltage is obtained by causing a first bonding layer and a second bonding layer to use such Au that is identical in kind of substance and in in-plane orientation and perpendicular orientation. Example 1 and Example 2 differ in terms of the question as to whether the GaN-based semiconductor light-emitting device is subjected to the tapering work. It is nevertheless found by comparing Example 1 and Example 2 that the impartation of the tapering work is favorable for the sake of enhancing the output. Since the tapering work results in adding to the number of steps of process, the choice thereof may be made to suit the purpose of use.

As illustrated in Example 3, no mutual diffusion-preventing layer is required when the reflecting layer uses Al. The use of Al, however, is apt to induce slight reduction of the reflectance and consequently lower the output slightly. Ag entails the problem of migration or the like. Thus, the adoption of Ag and Al may be chosen to suit the purpose of use.

Then, in Examples 6 to 14, the mutual diffusion-preventing layer was installed for the purpose of preventing mutual diffusion in the case of using Au, a substance inducing total conversion into a solid solution with Ag, and Pd in the first bonding layer and the mutual diffusion-preventing layer was not deliberately used in the case of using other metal.

Examples 6 to 12 show that the use of Ag, Cu, Pt, Pd, Rh, Ir, Ru and Re instead of Au in the first bonding layer and the second bonding layer has the same effect as the use of Au.

Example 13 shows that even when the first bonding layer uses Au and the second bonding layer uses Ag and these bonding layers consequently involve bonding of Au and Ag, namely different kinds of metal, good bonding is acquired because Au and Ag possess an equal face-centered cubic structure and confine difference in lattice constant within 0.2%.

Example 14 shows that even when the first bonding layer uses Au and the second bonding layer uses Pt and these bonding layers consequently involve bonding of Au and Pt, namely different kinds of metal, good bonding is acquired because Au and Pt possess an equal face-centered cubic structure and confine difference in lattice constant within 4%.

Comparative Example 1 shows that when the (111) face of the first bonding layer formed of Au is directly applied to the (111) face formed of Si of the electroconductive substrate, no bonding is acquired because of a difference of 25% in lattice constant.

Comparative Example 2 shows that since Pt, in the absence of a lattice-matching layer, gives rise to not only (111) orientation but also (200) orientation on the Si (111) face, the relevant orientations are not lined up in one axis and the adhesion is consequently inferior.

Comparative Example 3 shows that when the first bonding layer uses Cu and the second bonding layer uses Au and these bonding layers consequently involve bonding of Cu and Au, namely different kinds of metal, no good bonding is acquired because Cu and Au have a difference of 12% in lattice constant in spite of possessing an equal face-centered cubic structure.

Comparative Example 4 shows that even when the first bonding layer and the second bonding layer use the same kind of metal, the relevant orientations are not lined up in one axis and the adhesion is consequently inferior as supported by the fact that Cr possessing a face-centered cubic structure exhibits crystal orientations of (200) and (110).

Example 15

Figure 18:
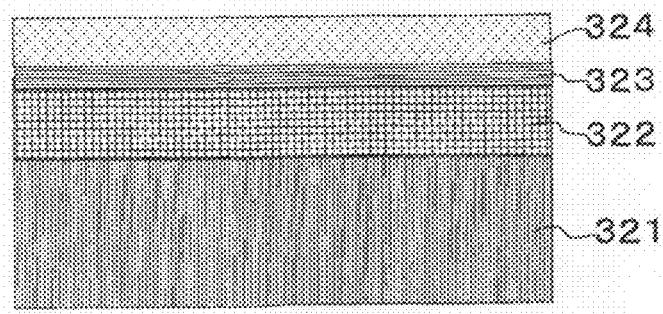
FIG. 18 is a schematic cross section illustrating the second stacked body of Example 15.

A first stacked body 110 shown in FIG. 9 was prepared in the same manner as in Example 1. On the other hand, such a second stacked body 320 as illustrated in FIG. 18 was prepared by the following procedure. To be specific, a second stacked body 320 was prepared by having Ag deposited in a thickness of 50 nm as an orientation-adjusting layer 322, Pt in a thickness of 20 nm as a mutual diffusion-preventing layer 323, and Au in a thickness of 20 nm as a second bonding layer 324 in the order mentioned on an electroconductive substrate formed of Si single crystal possessing a (111) face as the surface thereof by the sputtering method.

Incidentally, the silicon substrate 321 was subjected to RCA cleaning and treated with diluted hydrofluoric acid (0.5 wt %) for 10 minutes prior to having Ag deposited thereon. The final degree of vacuum in the sputtering device was $1.0 \times 10^{-5}$ Pa.

Figure 19:
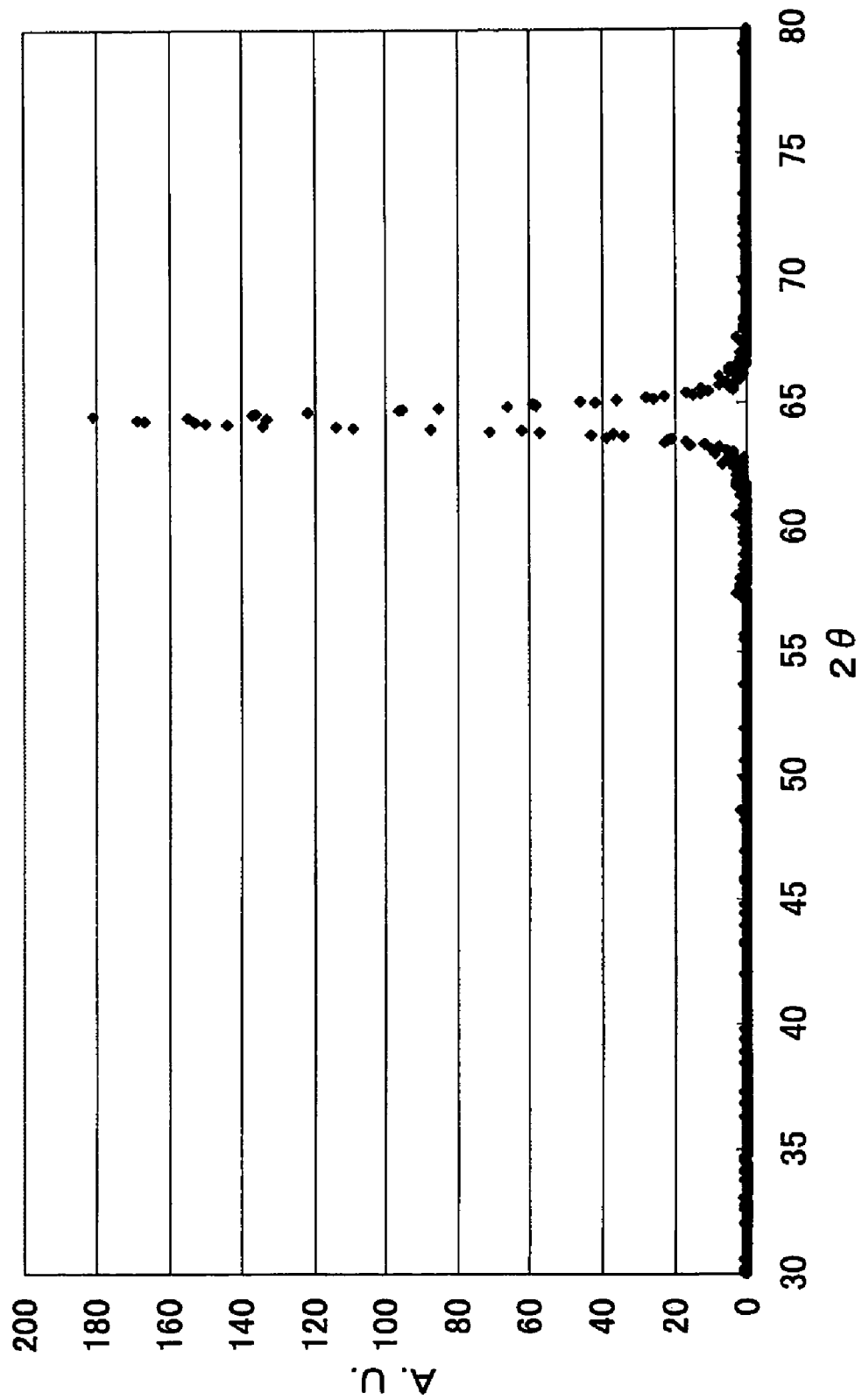
FIG. 19 is a diagram showing the results of the 2θ/φ determination of the orientation-adjusting layer in the second stacked body of Example 15.
Figure 20:
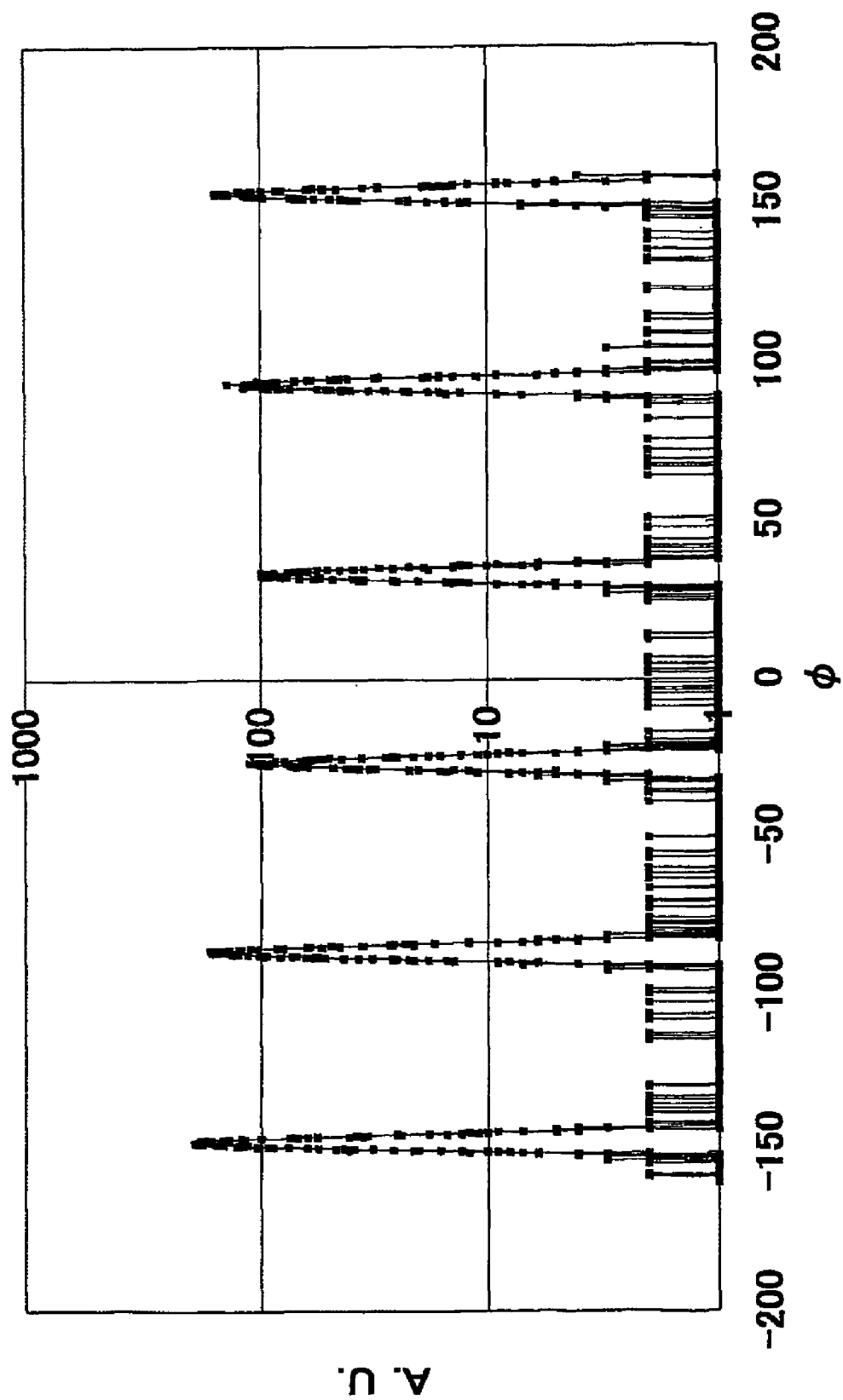
FIG. 20 is a diagram showing the results of the φ determination carried out with 2θ fixed at the Ag (220) peak in FIG. 19.
Figure 21:
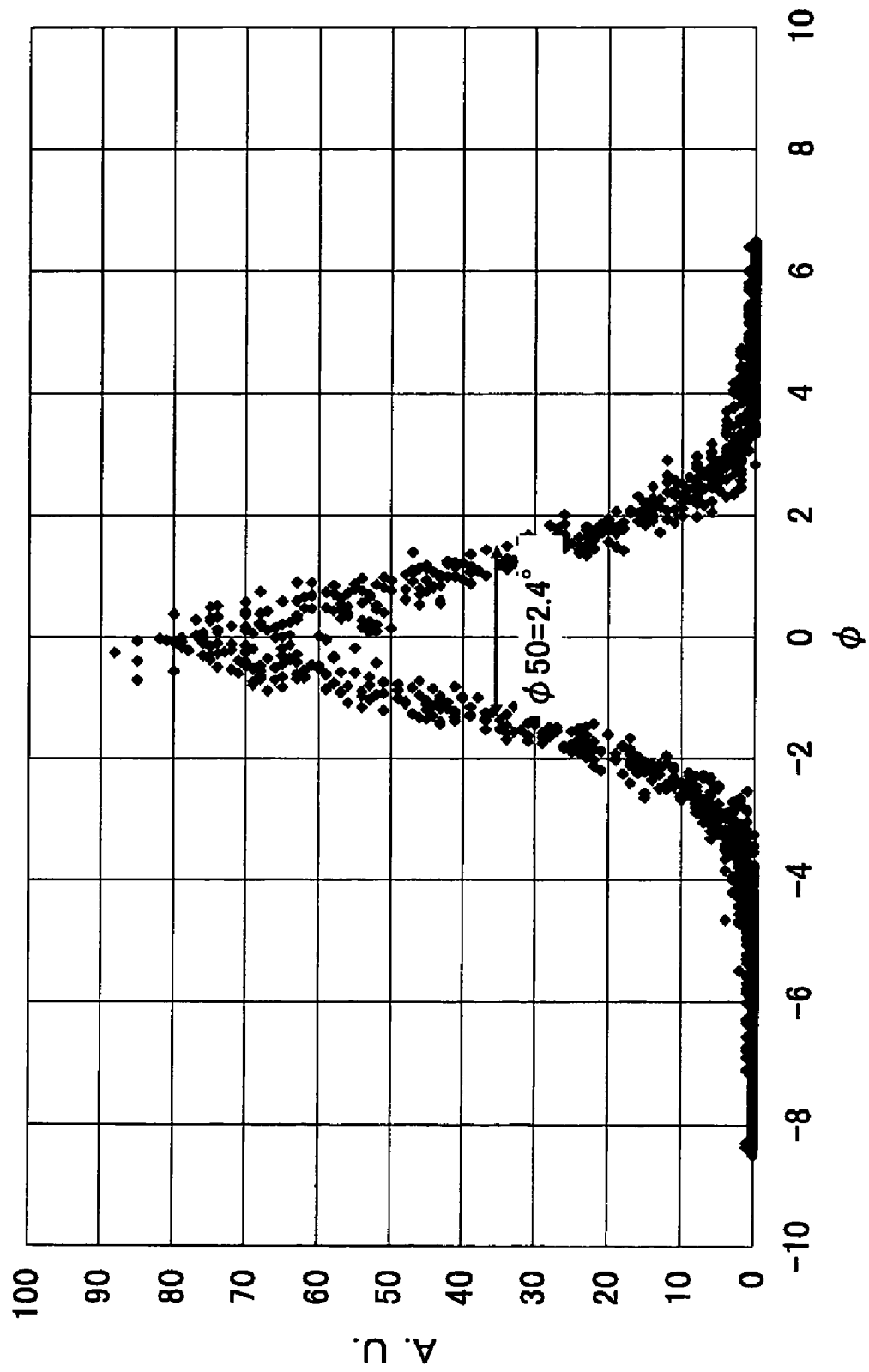
FIG. 21 is a diagram showing the details of one peak of FIG. 20 and depicting the peak half-value width (φ 50) in the orientation-adjusting layer.

The silicon substrate 321 at the stage of having Ag deposited in a thickness of 20 nm on the Si (111) face thereof was subjected to in-plane X-ray determination with a view to determining the orientation of Ag deposited on the (111) face thereof (Si (111) face). The results of determining 2θ/φ are shown in FIG. 19. Since the presence of an Ag (220) peak is confirmed in the diagram, it may be safely concluded that the Ag (111) orientation occurred in the perpendicular direction of the surface. FIG. 20 shows the results of the φ determination carried out, with 2θ fixed at the Ag (220) peak. The diagram shows six equidistantly separated peaks and clearly indicates hexagonal axis of symmetry. This fact allows safe inference that Ag was epitaxially grown on the Si (111). Incidentally the half-value width (φ50) of the peak in FIG. 20 is 2.4° as shown in FIG. 21.

Figure 22:
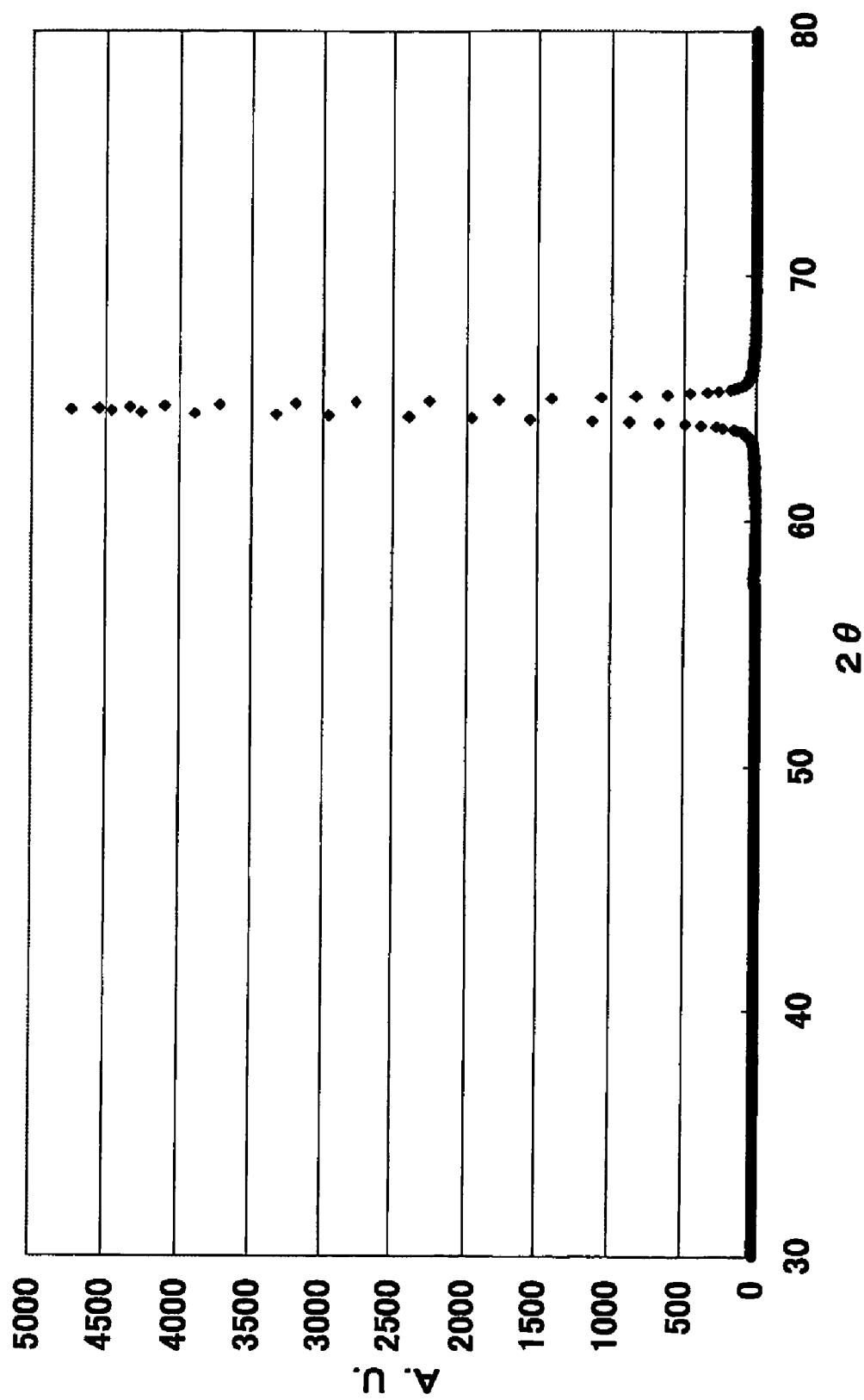
FIG. 22 is a diagram showing the results of the 2θ/φ determination of the second bonding layer in the second stacked body of Example 15.
Figure 23:
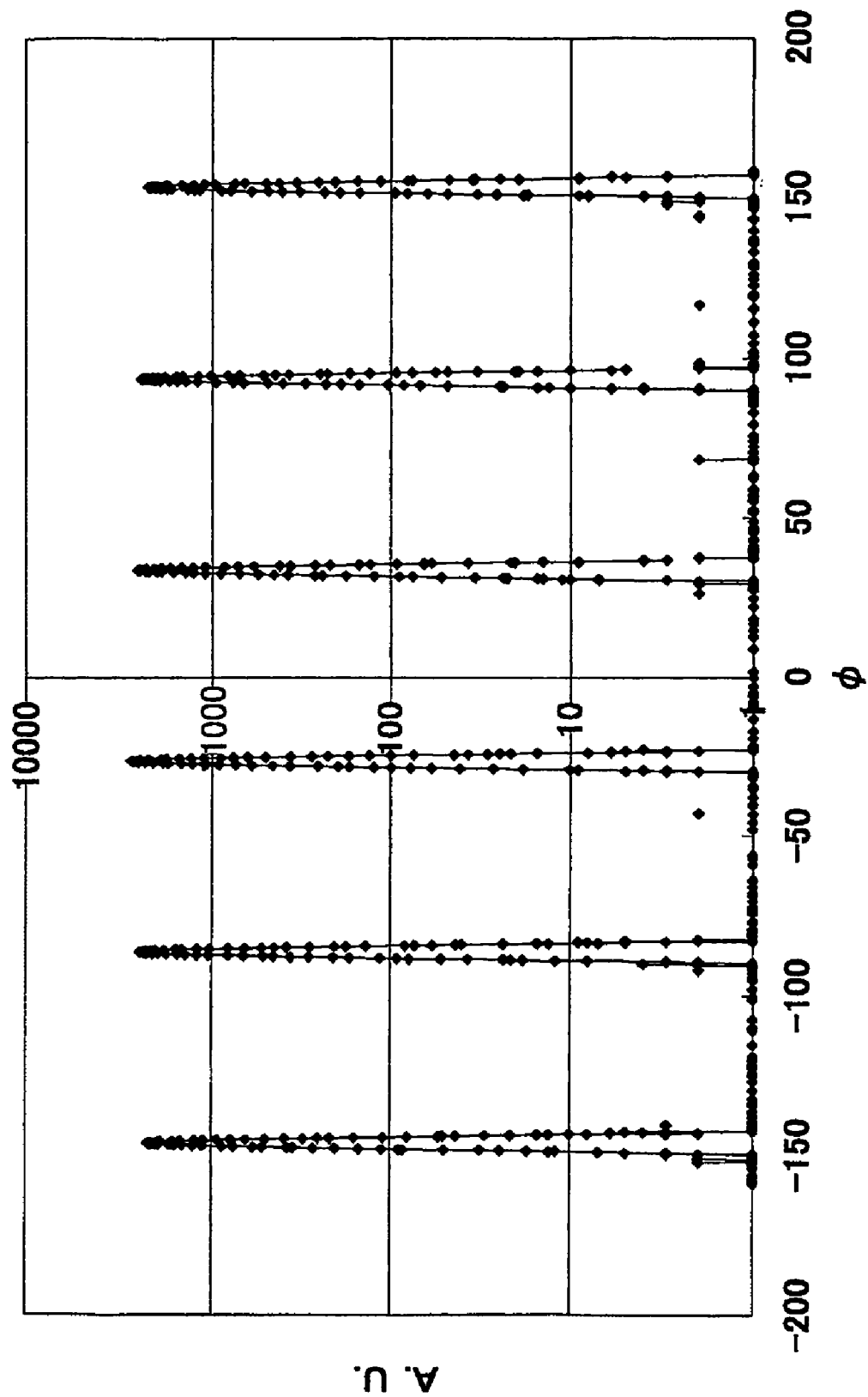
FIG. 23 is a diagram showing the results of the φ determination carried out with 2θ fixed at the Au (220) peak in FIG. 22.
Figure 24:
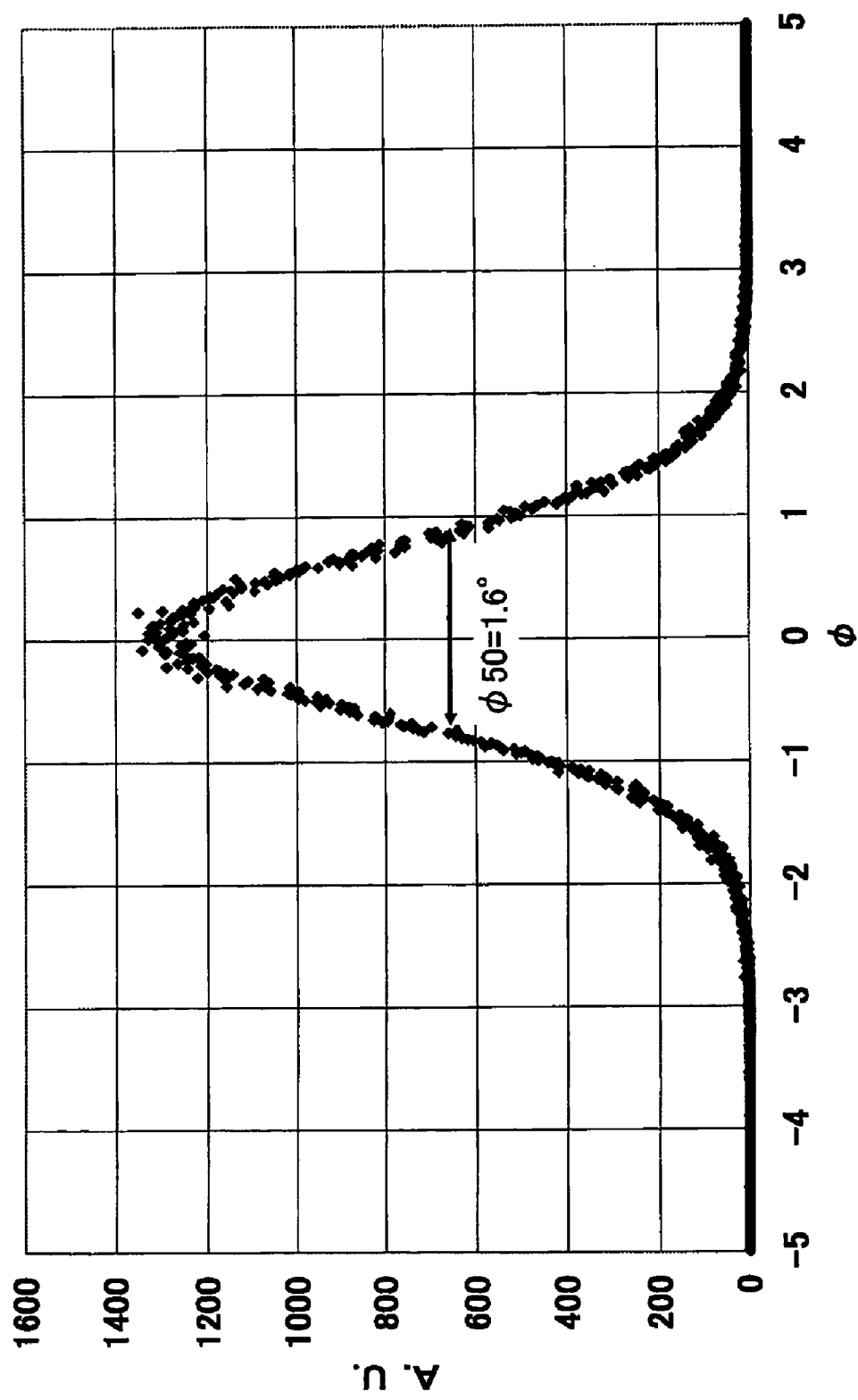
FIG. 24 is a diagram showing the details of one peak of FIG. 23 and depicting the peak half-value width (φ 50) in the second bonding layer.

Further, the silicon substrate 321 at the stage of having finished deposition thereon of the second bonding layer 324 formed of Au was subjected to in-plane X-ray determination. The results of determining 2θ/φ are shown in FIG. 22. Since the presence of an Au (220) peak is confirmed in the diagram, it may be safely concluded that the Ag (111) orientation occurred in the perpendicular direction of the surface. FIG. 23 shows the results of the φ determination carried out, with 2θ fixed at the Au (220) peak. The diagram shows six equidistantly separated peaks and clearly indicates hexagonal axis of symmetry. This fact allows safe inference that Au was epitaxially grown on the Si (111). Incidentally the half-value width (φ50) of the peak in FIG. 23 is 1.6° as shown in FIG. 24.

Figure 25:
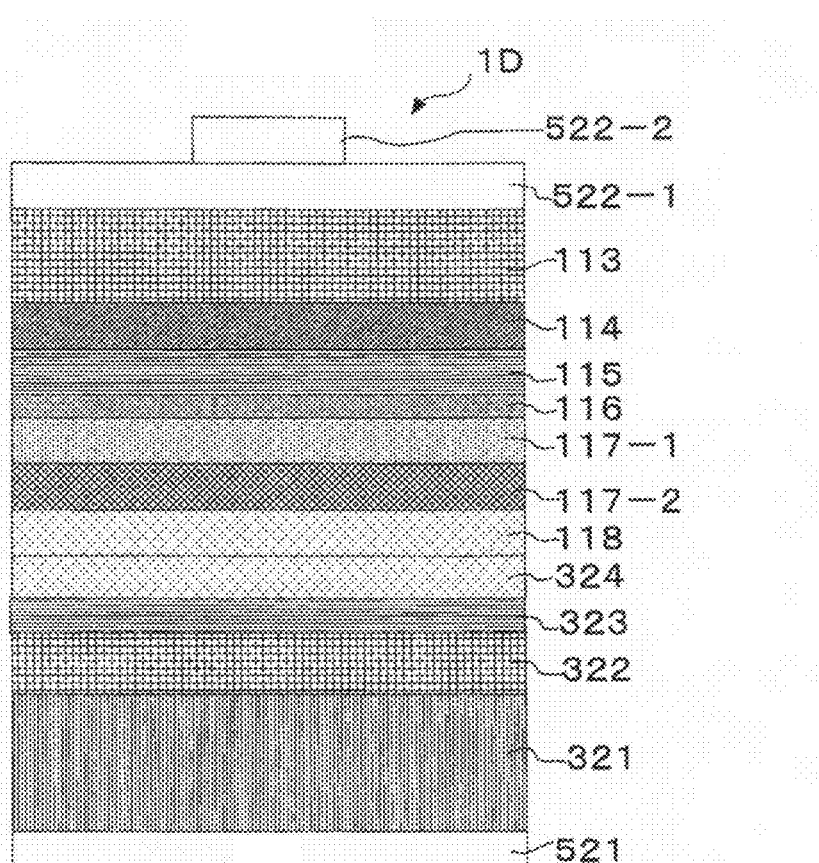
FIG. 25 is a schematic cross section illustrating the GaN-based semiconductor light-emitting device of Example 15 in the finished state.

GaN-based semiconductor light-emitting devices ID each measuring the square of 350 μm as shown in FIG. 25 were obtained by bonding the first stacked body 110 and the second stacked body 320 in the same manner as in Example 1, forming an ITO 522-1, a negative electrode 522-2 and a positive electrode 522 in the same manner as in Example 1, and partitioning the wafer consequently prepared by dicing.

The GaN-based semiconductor light-emitting devices ID consequently obtained were rated for light emission output Po, operating voltage Vf and the property of adhesion by following the procedure of Example 1. The light emission output Po was 12 mW, the operating voltage Vf was 3.0 V, and the number of sections surviving the peeling was 100, i.e. a magnitude indicating absence of peeling.

The main production conditions of Example 15 and the results of evaluation (light emission output Po, operating voltage Vf, and number of sections surviving the peeling test) are shown in Table 2 below.

TABLE 2

| | Reflecting layer | | Mutual diffusion-preventing layer | | First bonding layer | | | Second bonding layer | | | Orientation-adjusting layer | | | | Number of sections surviving peeling test |
|---|---|---|---|---|---|---|---|---|---|---|---|---|---|---|---|
| | Composition | Thickness (nm) | Composition | Thickness (nm) | Composition | Thickness (nm) | Orientation | Composition | Thickness (nm) | Orientation | Composition | Thickness (nm) | Po (mW) | Vf (V) | |
| Ex. 15 | Ag | 20 | Pt | 20 | Au | 20 | (111) | Au | 20 | (111) | Ag | 50 | 12 | 3.0 | 100 |
| Ex. 16 | Ag | 20 | Pt | 20 | Au | 20 | (111) | Au | 20 | (111) | Ag | 50 | 17 | 3.1 | 100 |
| Comp. Ex. 5 | Ag | 20 | Pt | 20 | Au | 20 | (200) + (111) | Au | 20 | (200) + (111) | Cr | 50 | 13 | 4.8 | 58 |

Example 16

Figure 26:
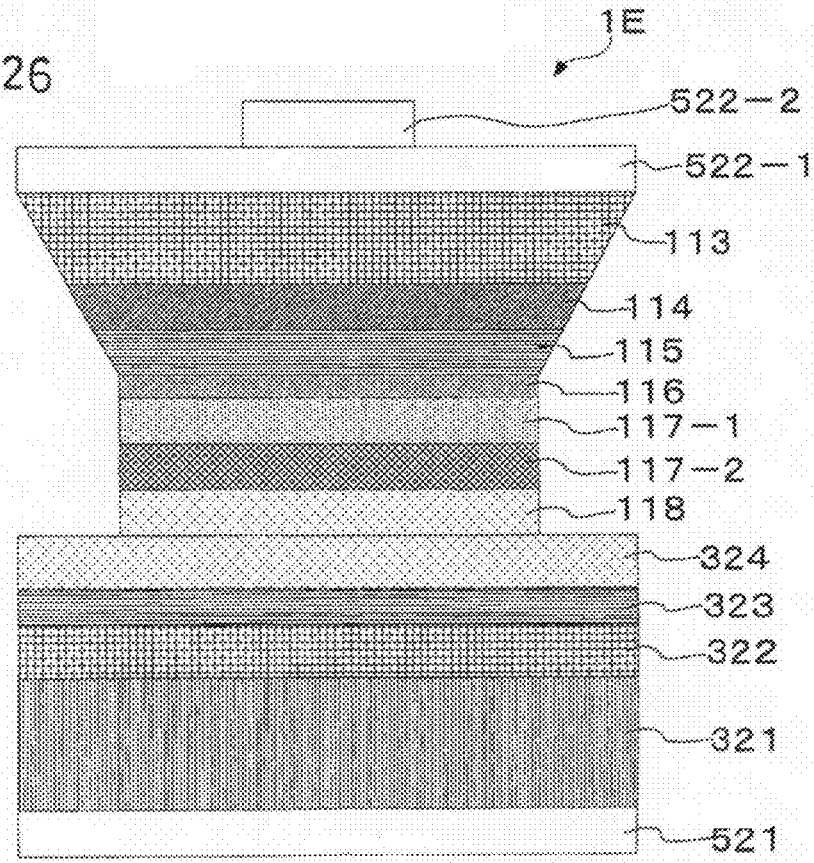
FIG. 26 is a schematic cross section illustration the GaN-based semiconductor light-emitting device of Example 16 in the finished state.

Such a GaN-based semiconductor light-emitting device 1E as shown in FIG. 26 was prepared by subjecting the first stacked body 110 prepared in Example 15 as described above to a tapering work in the same manner as in Example 2. Thus, Example 16 differs from Example 15 only in subjecting the first stacked body 110 to the tapering work.

The GaN-based semiconductor light-emitting devices 1E consequently obtained were rated for light emission output Po, operating voltage Vf, and the property of adhesion by following the procedure of Example 1. The light emission output Po was 17 mW, the operating voltage Vf was 3.1 V, and the number of sections surviving the peeling was 100, i.e. a magnitude indicating absence of peeling.

Comparative Example 5

Figure 27:
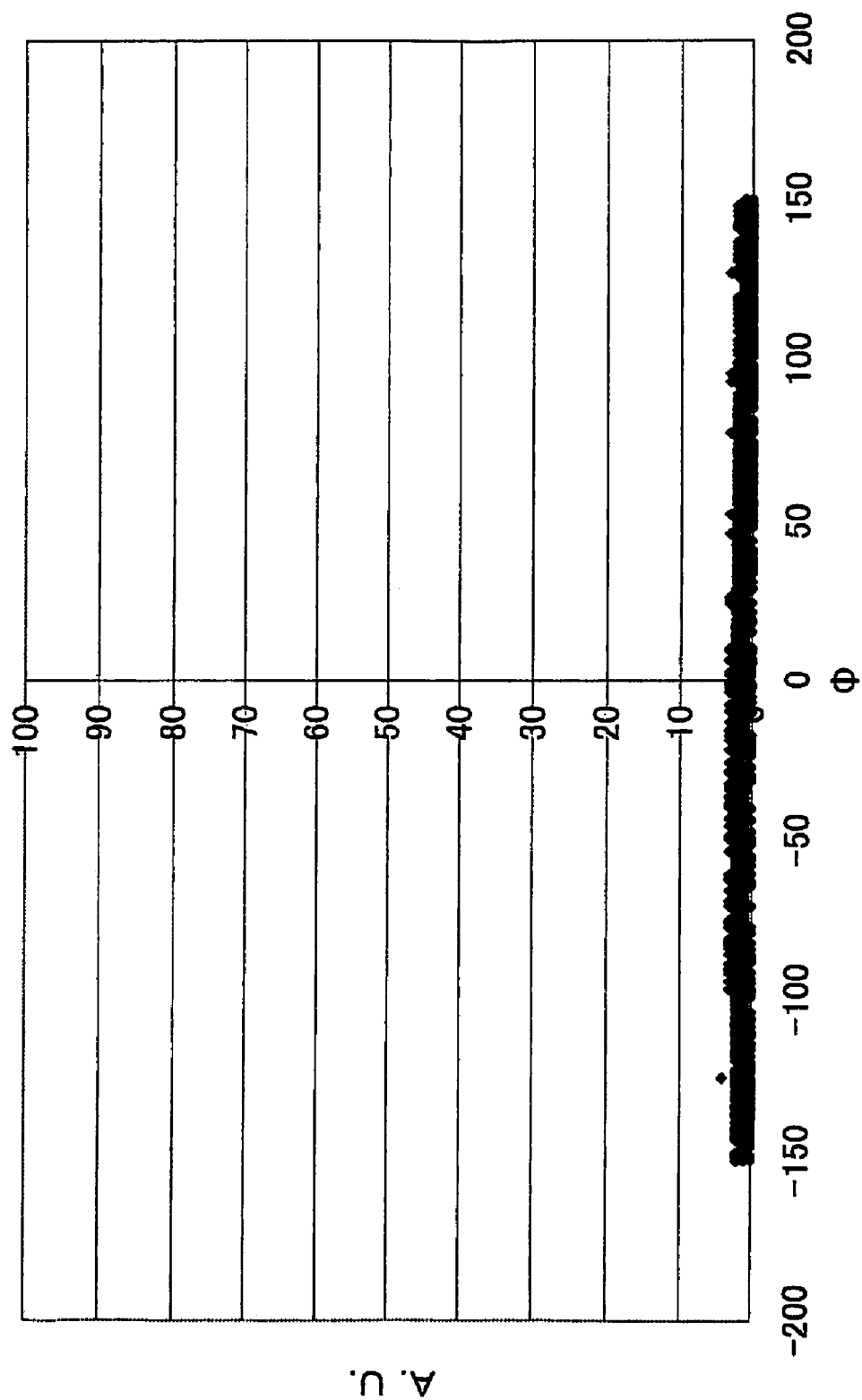
FIG. 27 is a diagram showing the results of the φ determination carried out with 2θ fixed at the Au (220) peak in the second bonding layer of Comparative Example 5.

GaN-based semiconductor light-emitting devices were prepared by following the procedure of Example 16 while having Cr deposited in a thickness of 50 nm and Au deposited in a thickness of 20 nm as a second bonding layer on an Si single crystal having a (111) face as the surface thereof in the order mentioned by sputtering and were rated in the same manner as in Examples 15 and 16. As regards the results of the evaluation, the light emission output Po was 13 mW, the operating voltage Vf was 4.6 V, and the number of section surviving the peeling test was 58. The device was subjected to the in-plane X-ray determination with a view to determining the orientation of the second bonding layer. FIG. 27 shows the results of the φ determination carried out, with 2θ fixed at Au (220). The diagram shows no discernible peak and consequently indicates absence of discernible sign of hexagonal axis of symmetry. Further, the out-plane X-ray determination (θ/2θ method) showed discernible peaks of Au (111), Au (220) and Au (200), i.e. a fact that indicates absence of a uniaxial orientation in the perpendicular direction of the surface.

INDUSTRIAL APPLICABILITY

It is possible to provide a GaN-based semiconductor light-emitting device capable of heightening bonding strength and amply lowering resistance component on the bonding interface, by bonding an electroconductive substrate to a stacked body resulting from stacking GaN-based semiconductors on a substrate and then removing the substrate on the stacked body side.

The invention claimed is:

1. A GaN-based semiconductor light-emitting device comprising:
    a stacked body having an n-type semiconductor layer, a light-emitting layer and a p-type semiconductor layer, each formed of a GaN-based semiconductor, sequentially stacked and provided with a first bonding layer made of metal as an outermost layer of the stacked body;
    an electroconductive substrate; and
    a second bonding layer formed on the electroconductive substrate and bonded to a bonding surface of the first bonding layer,
    wherein the bonding surface is opposite a side of the second bonding layer on which the electroconductive substrate is formed, and wherein the second bonding layer is made of a metal of a same crystal structure as the first bonding layer, and allowed to exhibit an identical crystal orientation both in a perpendicular direction of the bonding surface and in an in-plane direction of the bonding surface, and wherein the first bonding layer and the second bonding layer possess a face centered cubic structure and exhibit a crystal orientation of (111) in the perpendicular direction of the bonding surface.

2. A GaN-based semiconductor light-emitting device according to claim 1, further comprising a lattice-matching layer formed between the electroconductive substrate and the second bonding layer.

3. A GaN-based semiconductor light-emitting device according to claim 2, wherein the lattice-matching layer is made of a simple metal of any one member or a metal alloy of two or more members selected from the group consisting of Hf, Mg and Zr.

4. A GaN-based semiconductor light-emitting device according to claim 1, wherein the first bonding layer and the second bonding layer are each formed of any one of Au, Ag, Cu, Pt, Pd, Rh, Cu and Ir.

5. A GaN-based semiconductor light-emitting device according to claim 4, wherein the first bonding layer and the second bonding layer are each formed of Au or an Au alloy.

6. A GaN-based semiconductor light-emitting device according to claim 1, wherein the first bonding layer and the second bonding layer have a difference within 5% in lattice constant.

7. A GaN-based semiconductor light-emitting device according to claim 1, wherein the electroconductive substrate is a single-crystal silicon substrate.

8. A GaN-based semiconductor light-emitting device according to claim 7, wherein the electroconductive substrate is a single-crystal silicon substrate and possesses a (111) face as a substrate surface.

9. A GaN-based semiconductor light-emitting device according to claim 8, wherein the second bonding layer is directly deposited on the (111) face of the single-crystal silicon substrate.

10. A GaN-based semiconductor light-emitting device according to claim 8, further comprising an orientation adjusting layer formed between the single-crystal silicon substrate and the second bonding layer.

11. A GaN-based semiconductor light-emitting device according to claim 10, wherein the orientation adjusting layer is formed of Ag or an Ag alloy.

12. A method for the fabrication of a GaN-based semiconductor light-emitting device, comprising the steps of:
    forming on a substrate a first stacked body having sequentially stacked at least an n-type semiconductor layer, a light-emitting layer and a p-type semiconductor layer each formed of a GaN-based semiconductor and having a first bonding layer made of metal as an uppermost layer of the stacked body;
    forming on an electroconductive substrate a second stacked body possessing a second bonding layer made of a metal of a same crystal structure as the first bonding layer and exhibiting an identical crystal orientation in both a perpendicular direction of a bonding surface and an in-plane direction of the bonding surface;
    integrating the first stacked body and the second stacked body by mutual bonding; and
    removing the substrate from the first stacked body, wherein the first bonding layer and the second bonding layer possess a face centered cubic structure and exhibit a crystal orientation of (111) in the perpendicular direction of the bonding surface.

13. A. method for the fabrication of a GaN-based semiconductor light-emitting device according to claim 12, wherein the mutual bonding is implemented by irradiating bonding surfaces of the bonding layers in vacuum with an inert gas ion beam or an inert gas neutral atom beam.

14. A method for the fabrication of a GaN-based semiconductor light-emitting device according to claim 12, wherein the substrate is made of sapphire.

15. A method for the fabrication of a GaN-based semiconductor light-emitting device according to claim 12, wherein the electroconductive substrate is a single crystal silicon substrate and possessing a (111) face as a substrate surface and, when the second bonding layer has a face-centered cubic structure (111) face of Au, Ag, Cu, Pt, Pd, Rh, Cu or Ir or a hexagonal closest packing (0001) face of Ru or Re, the substrate surface is cleaned by RCA cleaning and then subjected to hydrogen termination with dilute hydrofluoric acid, and thereafter the second bonding layer is formed using a film-depositing device provided with vacuum.

16. A method for the fabrication of a GaN-based semiconductor light-emitting device according to claim 15, wherein the vacuum is under pressure of less than $1.0 \times 10^{-4}$ Pa.

17. A GaN-based semiconductor light-emitting device comprising:
    a stacked body having an n-type semiconductor layer, a light-emitting layer and a p-type semiconductor layer, each formed of a GaN-based semiconductor, sequentially stacked and provided with a first bonding layer made of metal as an outermost layer of the stacked body;
    an electroconductive substrate; and
    a second bonding layer formed on the electroconductive substrate and bonded to a bonding surface of the first bonding layer, wherein the bonding surface is opposite a side of the second bonding layer on which the electroconductive substrate is formed, wherein the second bonding layer is made of a metal of a same crystal structure as the first bonding layer, and allowed to exhibit an identical crystal orientation both in a perpendicular direction of the bonding surface and in an in-plane direction of the bonding surface, and wherein the first bonding layer and the second bonding layer each has a hexagonal closest packing structure and a crystal orientation of (0001) in the perpendicular direction of the bonding surface.

18. A GaN-based semiconductor light-emitting device according to claim 17, wherein the first bonding layer and the second bonding layer are each formed of Ru or Re.

19. A method for the fabrication of a GaN-based semiconductor light-emitting device, comprising the steps of:
forming on a substrate a first stacked body having sequentially stacked at least an n-type semiconductor layer, a light-emitting layer and a p-type semiconductor layer each formed of a GaN-based semiconductor and having a first bonding layer made of metal as an uppermost layer of the stacked body;
forming on an electroconductive substrate a second stacked body possessing a second bonding layer made of a metal of a same crystal structure as the first bonding layer and exhibiting an identical crystal orientation in both a perpendicular direction of a bonding surface and an in-plane direction of the bonding surface;
integrating the first stacked body and the second stacked body by mutual bonding; and
removing the substrate from the first stacked body, wherein the first bonding layer and the second bonding layer each has a hexagonal closest packing structure and a crystal orientation of (0001) in the perpendicular direction of the bonding surface.

20. A method for the fabrication of a GaN-based semiconductor light-emitting device according to claim 19, wherein the mutual bonding is implemented by irradiating bonding surfaces of the bonding layers in vacuum with an inert gas ion beam or an inert gas neutral atom beam.

21. A method for the fabrication of a GaN-based semiconductor light-emitting device according to claim 19, wherein the substrate is made of sapphire.

22. A method for the fabrication of a GaN-based semiconductor light-emitting device according to claim 19, wherein the electroconductive substrate is a single crystal silicon substrate and possessing a (111) face as a substrate surface and, when the second bonding layer has a face-centered cubic structure (111) face of Au, Ag, Cu, Pt, Pd, Rh, Cu or Ir or a hexagonal closest packing (0001) face of Ru or Re, the substrate surface is cleaned by RCA cleaning and then subjected to hydrogen termination with dilute hydrofluoric acid, and thereafter the second bonding layer is formed using a film-depositing device provided with vacuum.

23. A method for the fabrication of a GaN-based semiconductor light-emitting device according to claim 22, wherein the vacuum is under a pressure of less than $1.0 \times 10^{-4}$ Pa.

24. A method for the fabrication of a GaN-based semiconductor light-emitting device, comprising the steps of:
forming on a substrate a first stacked body having sequentially stacked at least an n-type semiconductor layer, a light-emitting layer and a p-type semiconductor layer each formed of a GaN-based semiconductor and having a first bonding layer made of metal as an uppermost layer of the stacked body;
forming on an electroconductive substrate a second stacked body possessing a second bonding layer made of a metal of a same crystal structure as the first bonding layer and exhibiting an identical crystal orientation in both a perpendicular direction of a bonding surface and an in-plane direction of the bonding surface;
forming a lattice-matching layer formed between the electroconductive substrate and the second bonding layer;
integrating the first stacked body and the second stacked body by mutual bonding; and
removing the substrate from the first stacked body, wherein the lattice-matching layer is made of a simple metal of any one member or a metal alloy of two or more members selected from the group consisting of Hf, Mg and Zr.

* * * * *